(12) United States Patent
Kamijima et al.

(10) Patent No.: US 7,924,356 B2
(45) Date of Patent: Apr. 12, 2011

(54) ELECTROOPTICAL DEVICE, ELECTRONIC APPARATUS, AND PROJECTOR

(75) Inventors: Shunji Kamijima, Hara-mura (JP); Teiichiro Nakamura, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 1030 days.

(21) Appl. No.: 11/617,269

(22) Filed: Dec. 28, 2006

(65) Prior Publication Data

US 2007/0165147 A1    Jul. 19, 2007

(30) Foreign Application Priority Data

Jan. 16, 2006  (JP) ................. 2006-007144

(51) Int. Cl.
*G02F 1/136* (2006.01)
*G02F 1/1343* (2006.01)
*H01L 29/94* (2006.01)
*H01L 29/00* (2006.01)

(52) U.S. Cl. .............. 349/43; 349/38; 257/72; 257/301; 257/302

(58) Field of Classification Search .................. 257/301, 257/302
See application file for complete search history.

(56) References Cited

U.S. PATENT DOCUMENTS

| 5,317,432 | A  | 5/1994 | Ino |
| 6,762,809 | B1 | 7/2004 | Murade |
| 6,885,417 | B2 | 4/2005 | Murade |
| 7,161,592 | B2 | 1/2007 | Murade |
| 2003/0197828 | A1 | 10/2003 | Ha |

FOREIGN PATENT DOCUMENTS

| CN | 1290866 A | | 4/2001 |
| JP | A-05-297413 | | 11/1993 |
| JP | 07270819 A | * | 10/1995 |
| JP | A-09-260668 | | 10/1997 |
| JP | A-2000-047258 | | 2/2000 |
| JP | A 2000-98409 | | 4/2000 |
| JP | A 2002-31796 | | 1/2002 |
| JP | A 2002-244154 | | 8/2002 |
| JP | A-2003-152086 | | 5/2003 |
| JP | A-2004-046092 | | 1/2004 |
| JP | A-2005-115104 | | 4/2005 |

OTHER PUBLICATIONS

Machine translation of JP7-270819A; Oct. 1995; Okamoto.*

* cited by examiner

*Primary Examiner* — Wen-Ying P Chen
(74) *Attorney, Agent, or Firm* — Oliff & Berridge, PLC

(57) ABSTRACT

An electrooptical device includes a substrate having pixel regions arranged in a matrix, pixel electrodes disposed in the pixel regions of the substrate, switching elements disposed between the pixel regions of the substrate and electrically connected to the pixel electrodes, capacitors disposed between the pixel regions of the substrate to hold electrical charge on the pixel electrodes, wiring disposed between the pixel regions of the substrate, and grooves disposed in a surface of the substrate so as to extend between the pixel regions thereof. The capacitors each include a first capacitor electrode, an insulating film, and a second capacitor electrode. The wiring includes data lines and scanning lines corresponding to the switching elements. The capacitors are at least partially disposed in the grooves.

14 Claims, 24 Drawing Sheets

US 7,924,356 B2

ELECTROOPTICAL DEVICE, ELECTRONIC APPARATUS, AND PROJECTOR

BACKGROUND

1. Technical Field

The present invention relates to electrooptical devices, electronic apparatuses, and projectors.

2. Related Art

Electrooptical devices such as liquid crystal devices for use as, for example, light valves for projectors are often based on an active-matrix driving system including thin-film transistors (TFTs).

This type of liquid crystal device includes TFTs connected to pixel electrodes disposed in pixel regions. These TFTs are disposed in interpixel regions where data lines and scanning lines are also disposed to supply electrical signals to the TFTs. The liquid crystal device further includes capacitors that hold a predetermined electrical charge in operation to achieve stable operation.

Recently, more compact, higher-definition light valves having pixel regions with higher aperture ratios have been demanded. JP-A-2000-98409, JP-A-2002-31796, and JP-A-2002-244154, for example, discuss liquid crystal devices having capacitors formed in interpixel regions. Among these publications, JP-A-2000-98409 discloses a technique for forming grooves, called trenches, on a substrate and forming capacitor electrodes therein. This technique allows formation of capacitors along the bottoms and sidewalls of the trenches with high definition to efficiently increase capacitance without widening the interpixel regions.

The above technique, however, cannot sufficiently reduce the interpixel regions because the grooves are formed only in regions where the capacitors are to be formed. This technique therefore cannot significantly increase the aperture ratio of pixel regions.

SUMMARY

An advantage of some aspects of the invention is that they provide a more compact, higher-definition electrooptical device having pixel regions with a significantly increased aperture ratio and also provide an electronic apparatus and a projector which include the electrooptical device.

In electrooptical device according to a first aspect of the invention includes a substrate having pixel regions arranged in a matrix, pixel electrodes disposed in the pixel regions of the substrate, switching elements disposed between the pixel regions of the substrate and electrically connected to the pixel electrodes, capacitors disposed between the pixel regions of the substrate to hold electrical charge on the pixel electrodes, wiring disposed between the pixel regions of the substrate, and grooves disposed in a surface of the substrate so as to extend between the pixel regions thereof. The capacitors each include a first capacitor electrode, an insulating film, and a second capacitor electrode. The wiring includes data lines and scanning lines corresponding to the switching elements. The capacitors are at least partially disposed in the grooves.

That is, the capacitors are at least partially disposed in spaces defined by the grooves and a plane extending over the grooves along the surface of the substrate. According to the first aspect of the invention, the grooves are disposed in the surface of the substrate so as to extend between the pixel regions thereof, and the capacitors are at least partially disposed in the grooves so that the capacitors occupy smaller areas in interpixel regions Accordingly, the size of the electrooptical device can be reduced, and the area of the pixel regions can be increased relative to that of the interpixel regions. Thus, this structure contributes to size reduction and higher definition and can also significantly increase the aperture ratio of the pixel regions. In addition, the electrooptical device advantageously has increased light resistance because the area of the capacitors in the interpixel regions can be reduced to inhibit light reflection/absorption leading to an increase in the temperature of the device.

An electrooptical device according to a second aspect of the invention includes a substrate having pixel regions arranged in a matrix, pixel electrodes disposed in the pixel regions of the substrate, switching elements disposed between the pixel regions of the substrate and electrically connected to the pixel electrodes, capacitors disposed between the pixel regions of the substrate to hold electrical charge on the pixel electrodes, wiring disposed between the pixel regions of the substrate, and grooves disposed in a surface of the substrate so as to extend between the pixel regions thereof. The capacitors each include a first capacitor electrode, an insulating film, and a second capacitor electrode. The wiring includes data lines and scanning lines corresponding to the switching elements. The data lines are at least partially disposed in the grooves between the switching elements and the substrate.

According to the second aspect of the invention, the grooves are disposed in the surface of the substrate so as to extend between the pixel regions thereof, and the data lines are at least partially disposed in the grooves between the switching elements and the substrate so that the data lines occupy smaller areas in interpixel regions. Accordingly, the size of the electrooptical device can be reduced, and the area of the pixel regions can be increased. Thus, this structure contributes to size reduction and higher definition and can also significantly increase the aperture ratio of the pixel regions.

In addition, the data lines, which are formed of thin films in the known art, can be extended along the depth of the grooves to increase the cross-sectional area of the data lines. This allows for a reduction in the resistance of the data lines for efficient signal transmission. Furthermore, the electrooptical device advantageously has increased light resistance because the area of the data lines in the interpixel regions can be reduced to inhibit light reflection/absorption leading to an increase in the temperature of the device.

An electrooptical device according to a third aspect of the invention includes a substrate having pixel regions arranged in a matrix, pixel electrodes disposed in the pixel regions of the substrate, switching elements disposed between the pixel regions of the substrate and electrically connected to the pixel electrodes, capacitors disposed between the pixel regions of the substrate to hold electrical charge on the pixel electrodes, wiring disposed between the pixel regions of the substrate, and grooves disposed in a surface of the substrate so as to extend between the pixel regions thereof. The capacitors each include a first capacitor electrode, an insulating Film, and a second capacitor electrode. The wiring includes data lines and scanning lines corresponding to the switching elements. The capacitors are at least partially disposed in the grooves. The data lines are at least partially disposed in the grooves between the switching elements and the substrate.

According to the third aspect of the invention, the grooves are disposed in the surface of the substrate so as to extend between the pixel regions thereof, and the capacitors are at least partially disposed in the grooves so that the capacitors occupy smaller areas in interpixel regions. Also, the data lines are at least partially disposed. In the grooves between the switching elements and the substrate so that the data lines occupy smaller areas in the interpixel regions. Accordingly, the size of the electrooptical device can be reduced, and the area of the pixel regions can be increased. Thus, this structure contributes to size reduction and higher definition and can also significantly increase the aperture ratio of the pixel regions. In addition, the capacitors, the wiring, and the switching elements can be stacked in layers. Such a structure advantageously facilitates production of the electrooptical device.

Furthermore, the electrooptical device advantageously has increased light resistance because the areas of the capacitors and the data lines in the interpixel regions can be reduced to inhibit light reflection/absorption leading to an increase in the temperature of the device.

Preferably, the scanning lines are at least partially disposed in the grooves. In this case, the scanning lines occupy smaller areas in the interpixel regions. Accordingly, the size of the electrooptical device can be reduced, and the area of the pixel regions can be increased.

Preferably, the cross-sectional area of the grooves is larger on the opening side thereof than on the bottom side thereof. In this case, side surfaces of the grooves can be successfully covered with thin films such as the capacitors.

The electrooptical device according to the first aspect of the invention may further include light-shielding portions that cover intersection regions of the data lines and the scanning lines in plan view and do not overlap the pixel regions in plan view, and the width of the data lines and the scanning lines is preferably smaller than the maximum width of the light-shielding portions. If the width of the data lines and the scanning lines is smaller than the maximum width of the light-shielding portions, the area of the pixel regions can be increased to increase the aperture ratio thereof. In addition, if the maximum width of the light-shielding portions is larger than the width of the data lines and the scanning lines, light can be efficiently utilized by collecting it into the pixel regions in a circle using, for example, microlenses. Furthermore, if the light-shielding portions do not overlap the pixel regions in plan view, light can be efficiently utilized without being blocked when entering the pixel regions.

Alternatively, the electrooptical device may further include light-shielding portions covering the intersection regions of the data lines and the scanning lines in plan view and overlapping the pixel regions in plan view, and the width of the data lines and the scanning lines is preferably smaller than the maximum width of the light-shielding portions. Even if the light-shielding portions overlap the pixel regions in plan view, the area of the pixel regions can be increased to increase the aperture ratio thereof because the width of the data lines and the scanning lines is smaller than the maximum width of the light-shielding portions.

Preferably, the grooves extend along the capacitor electrodes of the capacitors and the wiring; the capacitor electrodes and the wiring are at least partially disposed in the grooves and are separated by insulating films; and the capacitor electrodes extend through the grooves along the wiring. In this case, both the capacitor electrodes and the wiring can be disposed in the interpixel regions without contact even though the interpixel regions are narrow regions.

Preferably, the capacitor electrodes are closer to the side surfaces of the grooves than the wiring. That is, the capacitor electrodes can be disposed outside the wiring in the grooves to increase the surface area of the capacitor electrodes. For example, the surface area of the capacitor electrodes can be increased by forming them on the side surfaces of the grooves.

Preferably, the capacitor electrodes are formed along bottom and side surfaces of the grooves. In this case, the surface area of the capacitor electrodes can be increased.

Preferably, the switching elements overlap the intersection regions of the wiring in plan view; the wiring has flat portions electrically connected thereto and extending from regions of the grooves corresponding to the intersection regions; and the switching elements and the flat portions are connected via contact holes. In this case, alignment can be easily performed to avoid connection defects even if the switching elements and the wiring are separated from each other in a direction parallel to the surface of the substrate. In addition, the switching elements and the wiring can be connected via the flat portions to ensure a sufficient contact area therebetween, stabilizing signal transmission and thus the operation of the switching elements.

Preferably, the switching elements are disposed in regions covered by the light-shielding portions in plan view. The intersection regions of the data lines and the scanning lines are positioned in regions surrounded by four corners of the pixel regions (intercorner regions). If the switching elements are disposed in the regions covered by the light-shielding portions in plan view, the switching elements overlap the corners of the pixel regions in plan view. If the light-shielding portions overlap the pixel regions in plan view, the light-shielding portions not only protect the switching elements from light, but also block light entering the corners of the pixel regions (pixel corner light).

It is known that the pixel corner light contributes to decreased image contrast in comparison with light passing through the centers of the pixel regions (pixel center light). According to the above aspects of the invention, the intensity of the pixel center light is increased because the aperture ratio of the pixel regions is increased relative to that of the known art. Accordingly, the intensity of the pixel center light, which contributes to higher contrast, is increased while the pixel corner light, which contributes to lower contrast, is blocked by the switching elements. This allows for a higher proportion of high-contrast light and thus a higher total contrast than those achieved by the known art.

It is also known that light passing through the periphery of the pixel regions other than the corners thereof (pixel periphery light) contributes to decreased image contrast in comparison with the pixel center light. If the switching elements are disposed in regions including the interpixel regions, the light-shielding portions covering the switching elements block the pixel periphery light. Accordingly, the intensity of the pixel central light, which contributes to higher contrast, is increased while the pixel periphery light, which contributes to lower contrast, is blocked by the switching elements. This allows for a higher proportion of high-contrast light and thus a higher total contrast than those achieved by the known art.

The electrooptical device preferably further includes microlenses that collect light into the pixel regions. Use of the microlenses for pixel regions having an increased aperture ratio can produce a synergistic effect of increasing light availability. In particular, the microlenses can also collect the pixel corner light, which would otherwise be blocked at the corners of the pixel regions if the switching elements are disposed therebetween, into the centers of the pixel regions to further increase the light availability.

An electronic apparatus may include the electrooptical device. This electronic apparatus can provide a bright display with high contrast because the aperture ratio of the pixel regions can be increased to enhance light availability.

A projector may include the electrooptical device. This projector can provide a bright display with high contrast because the aperture ratio of the pixel regions can be increased to enhance light availability.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

A first embodiment of the invention will now be described with reference to the drawings, where the individual components are illustrated on different scales if necessary for convenience of illustration. In this embodiment, a TFT active-matrix liquid crystal device including TFTs serving as pixel-switching elements will be described as an example.

Liquid Crystal Device

Figure 1A:
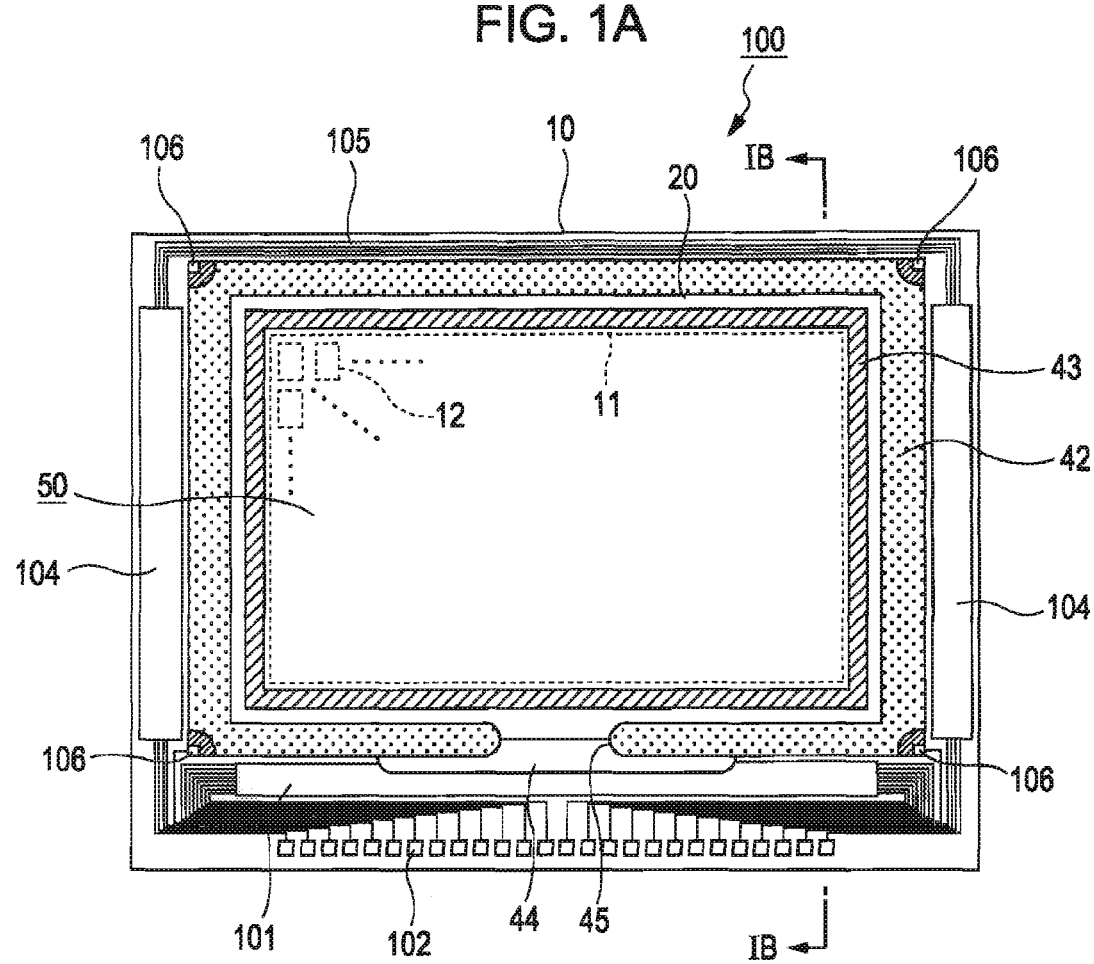
FIG. 1A is a plan view of the overall structure of a liquid crystal device according to a first embodiment of the invention.
Figure 1B:
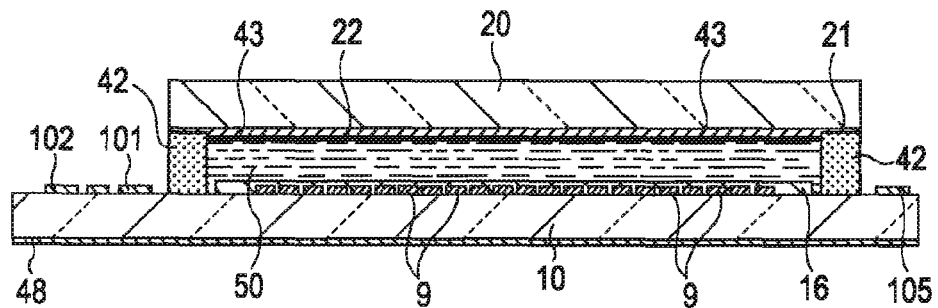
FIG. 1B is a sectional view of the overall structure of the liquid crystal device according to this embodiment.

FIG. 1A is a plan view of a liquid crystal device according to this embodiment. FIG. 1B is a sectional view taken along line 1B-1B of FIG. 1A. In FIGS. 1A and 1B, a liquid crystal device 100 according to this embodiment includes a TFT array substrate (active matrix substrate) 10 and a counter substrate 20 which are stacked and bonded with a seal 42 having a substantially rectangular frame shape in plan view. A liquid crystal layer 50 is sealed in a space surrounded by the seal 42. The liquid crystal layer 50 is formed of, for example, a liquid crystal material having positive dielectric anisotropy. The seal 42 has a liquid crystal inlet 45 (on the bottom side in FIG. 1A) filled with another seal 44. A side partition 43 having a substantially rectangular frame shape in plan view is disposed inside the seal 42 to define a pixel display region 11.

The pixel display region 11 includes pixel regions 12 arranged in a matrix, each defining one pixel, that is, the minimum display unit of the pixel display region 11. The pixel display region 11 is surrounded by peripheral circuits, including a data-line drive circuit 101 and external circuit mounting terminals 102 disposed along one side of the TFT array substrate 10 (the bottom side in FIG. 1A) and scanning-line drive circuits 104 disposed along two sides of the TFT array substrate 10 adjacent to the bottom side thereof.

Wiring 105 is disposed on the other side of the TFT array substrate 10 (the top side in FIG. 1A) to connect the two scanning-line drive circuits 104. Intersubstrate conductors 106 are disposed at the corners of the counter substrate 20 to electrically connect it to the TFT array substrate 10. The liquid crystal device 100 according to this embodiment, which is a transmissive liquid crystal device, modulates light emitted from a light source (not shown) disposed on the TFT array substrate 10 side and outputs the light through the counter substrate 20 as image light.

In FIG. 1B, pixel electrodes 9 are arranged on the inner side of the TFT array substrate 10 (on the liquid crystal layer 50 side) and are covered with an alignment film 16. The side partition 43 and a light-shielding film (not shown) are formed on the inner side of the counter substrate 20 and are covered with a common electrode 21. Another alignment film 22 is formed over the common electrode 21. A polarizer 48 is disposed on the outer side of the TFT array substrate 10 (facing away from the liquid crystal layer 50).

Figure 2:
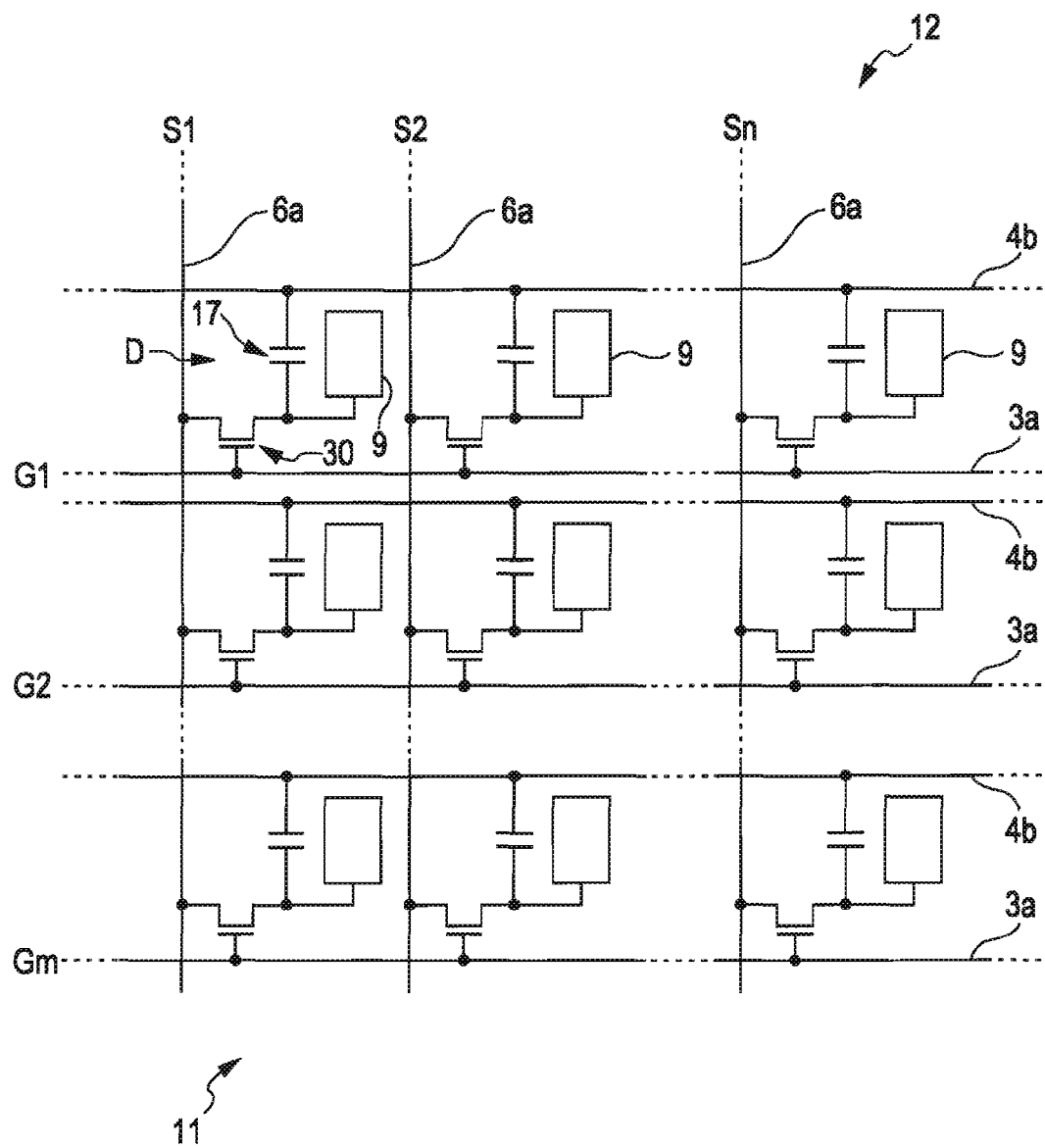
FIG. 2 is an equivalent circuit diagram of the liquid crystal device according to this embodiment.

FIG. 2 is an equivalent circuit diagram of the liquid crystal device 100. The pixel regions 12 are arranged in a matrix in the display region 11. The pixel electrodes 9 are disposed in the individual pixel regions 12. TFTs 30 are disposed beside the pixel electrodes 9 and are used as switching elements to control electrical connection to the pixel electrodes 9. Data lines 6a are connected to sources of the TFTs 30 and are supplied with image signals S1 to Sn from, for example, data-line drive elements.

Scanning lines 3a are connected to gates of the TFTs 30 and are supplied with pulsed scanning signals G1 to C-m from, for example scanning-line drive elements at predetermined timings. The pixel electrodes 9 are connected to drains of the TFTs 30.

When the scanning signals G1 to Gm are supplied via the scanning lines 3a to turn the TFTs 30 on for a predetermined period, the image signals S1 to Sn are supplied to the pixel regions 12 at predetermined timings via the data lines 6a and the pixel electrodes 9.

The image signals S1 to Sn are held in the pixel regions 12 by liquid crystal capacitors defined between the pixel electrodes 9 and the common electrode 21 for a predetermined period. Capacitors 17 are disposed between the pixel electrodes 9 and capacitor lines 4b in parallel with the liquid crystal capacitors to prevent leakage of the image signals S1 to Sn. Thus, the application of voltage signals to the liquid crystal changes the alignment of liquid crystal molecules, depending on the voltage levels of the signals, to modulate incident light emitted from a light source and generate image light.

Figure 3:
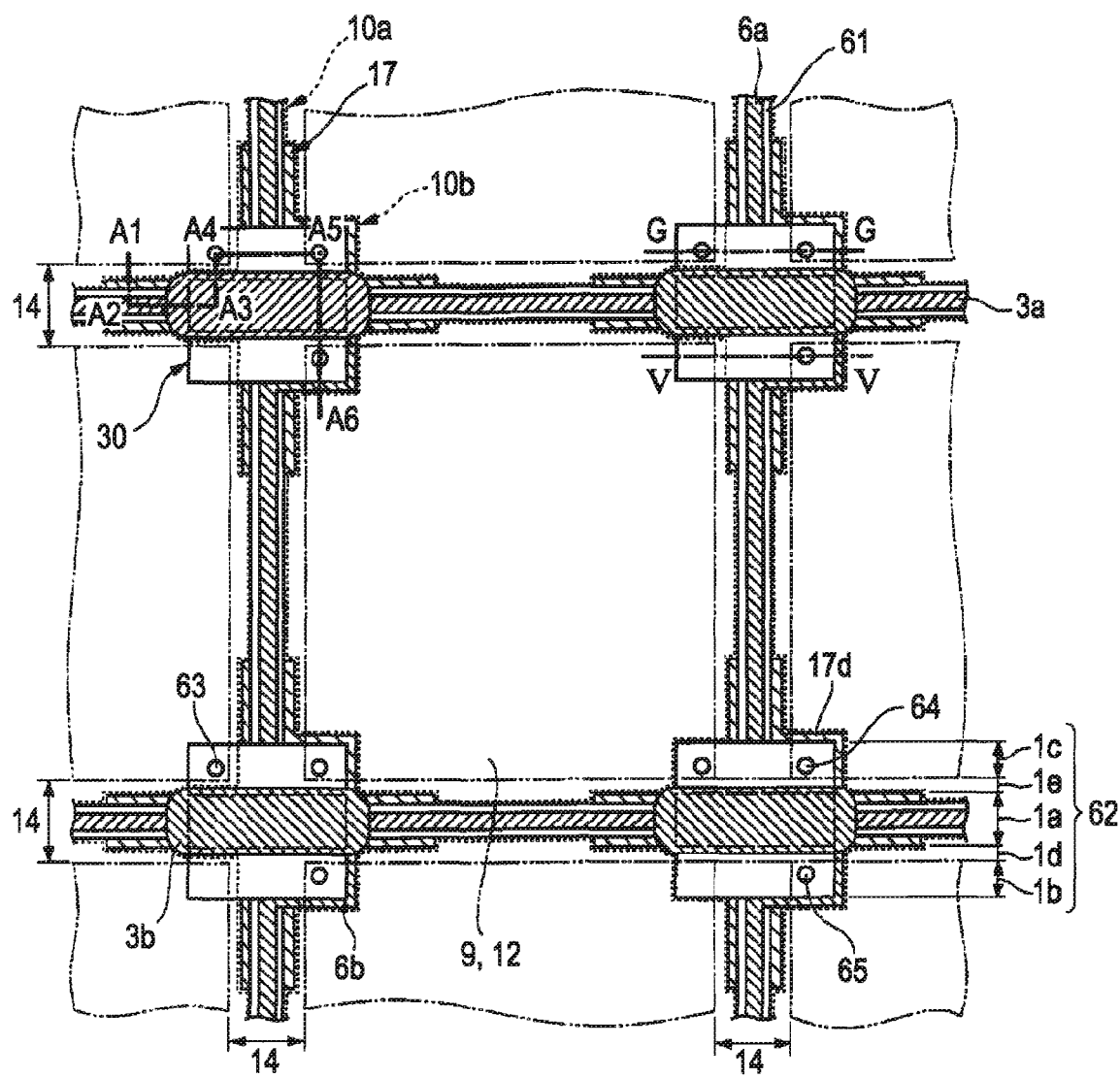
FIG. 3 is a plan view of the liquid crystal device according to this embodiment.
Figure 4:
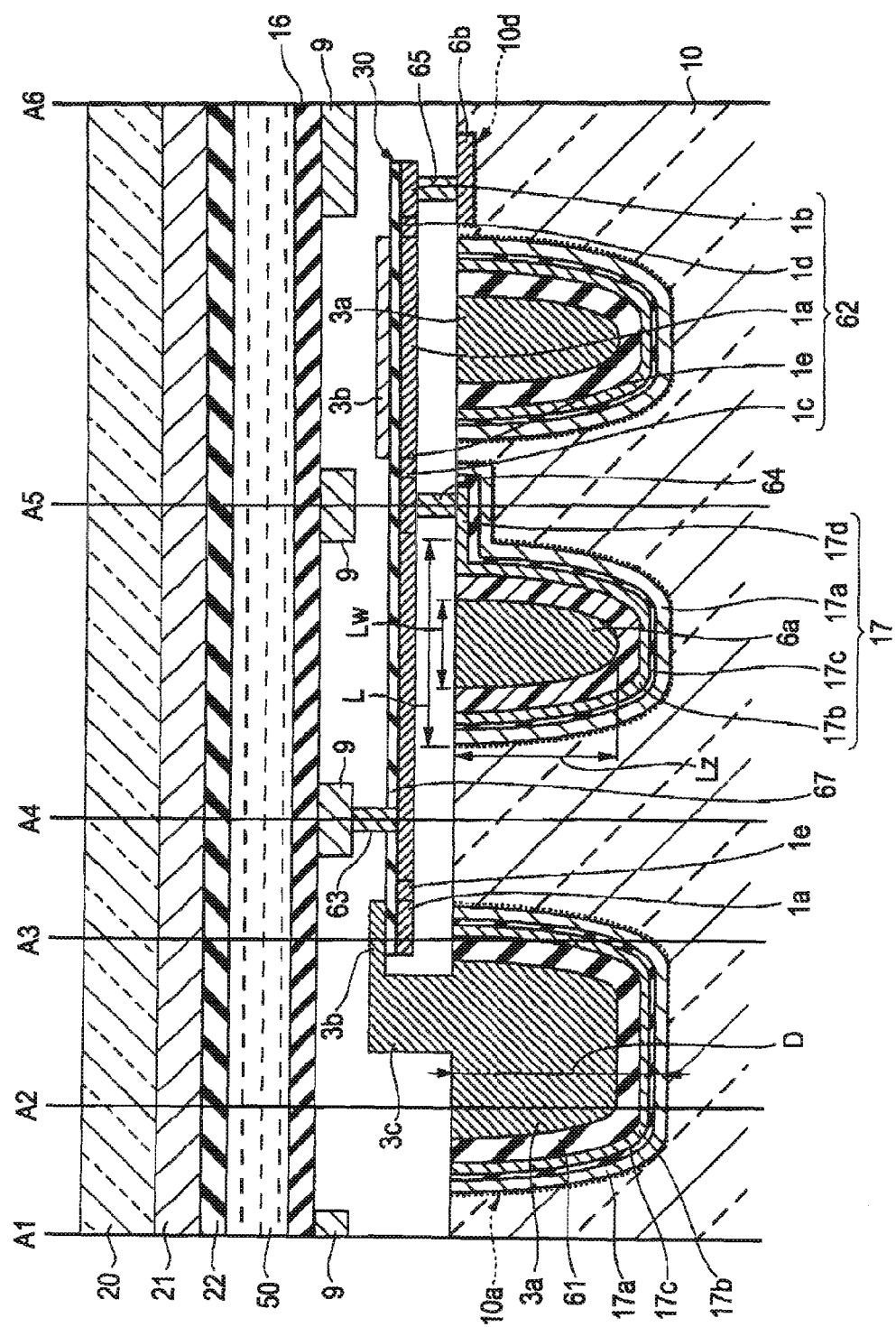
FIG. 4 is a sectional view of the liquid crystal device according to this embodiment.
Figure 5:
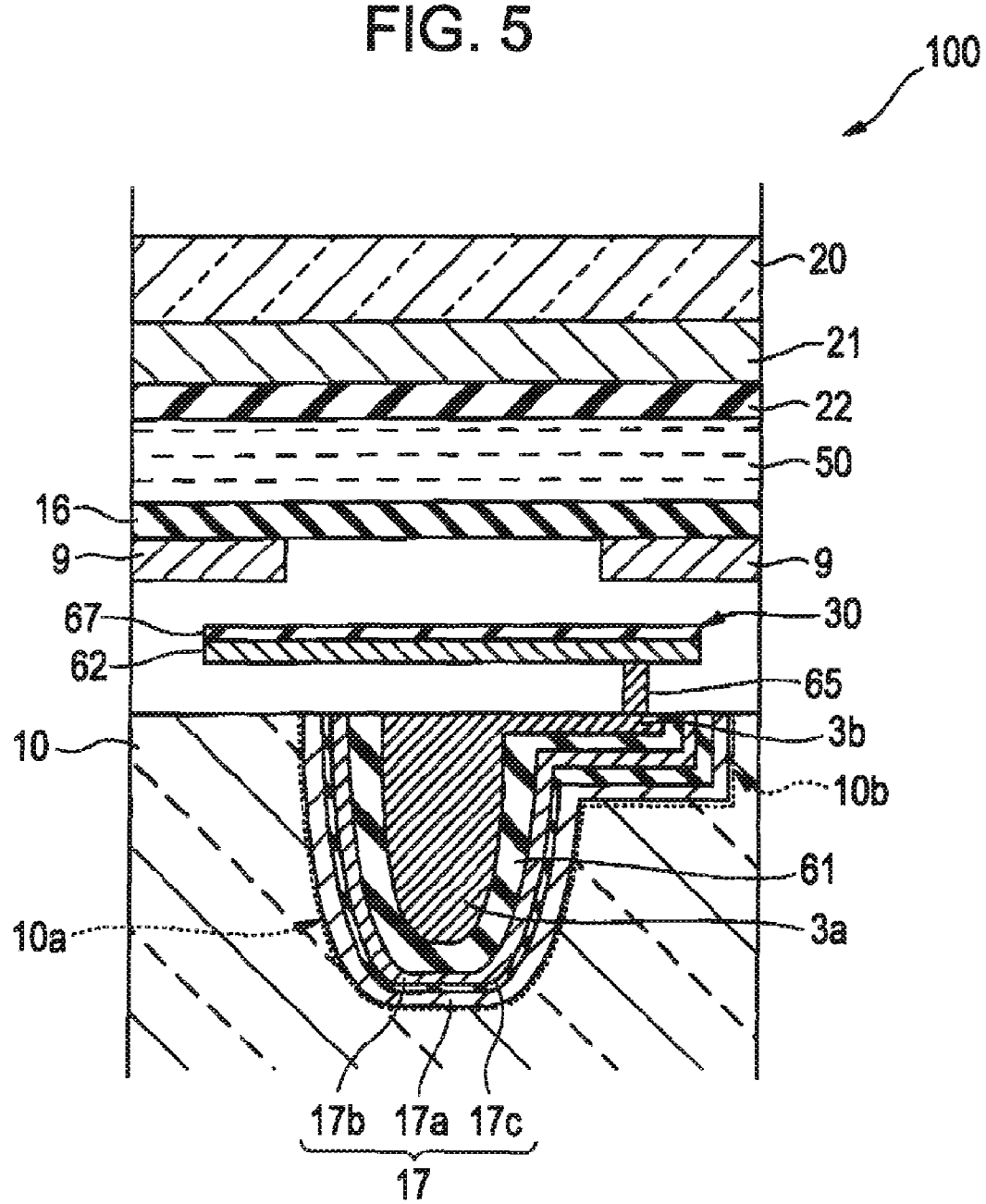
FIG. 5 is another sectional view of the liquid crystal device according to this embodiment.
Figure 6:
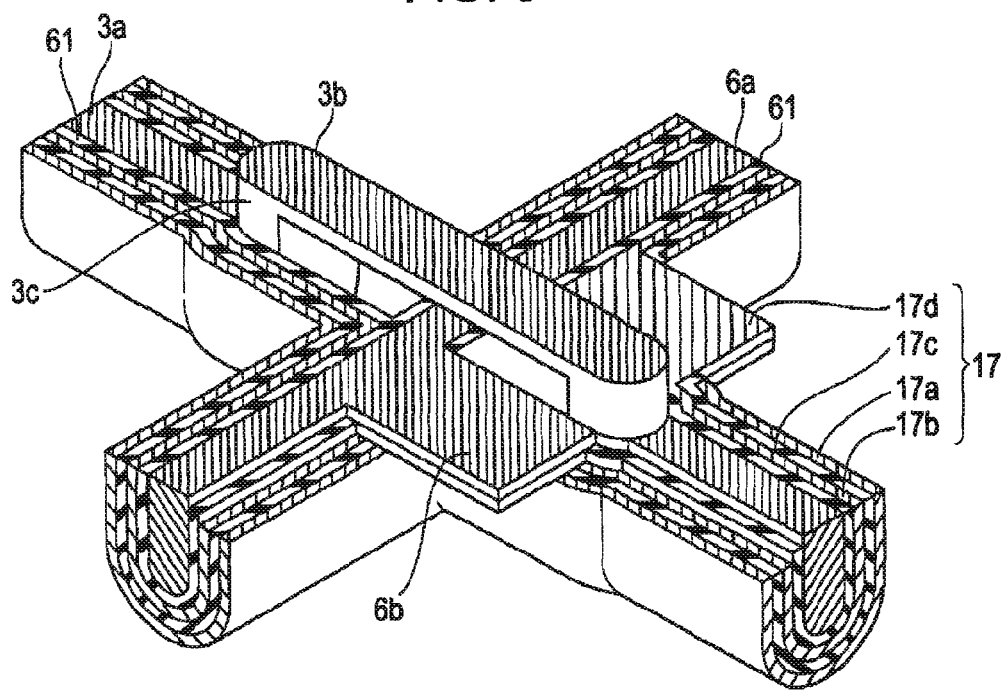
FIG. 6 is a perspective view of the wiring structure of the liquid crystal device according to this embodiment.

The pixel structure of the liquid crystal device 100 on the TFT array substrate 10 side will be described with reference to FIGS. 3 to 6. FIG. 3 is a plan view of the TFT array substrate 10, on which components such as the data lines 6a, the scanning lines 3a, and the pixel electrodes 9 are formed. In FIG. 3, the vertical direction corresponds to the lateral direction of the TFT array substrate 10, and the horizontal direction corresponds to the longitudinal direction of the TFT array substrate 10. FIG. 4 is a sectional view taken along line A1-A6 of FIG. 3. FIG. 5 is a sectional view taken along line V-V of FIG. 3. FIG. 6 is a perspective view of a wiring structure shown in FIG. 3 (the TFTs 30 are omitted).

In FIG. 3, the pixel electrodes 9 are disposed in the pixel regions 12 of the TFT array substrate 10. The term "pixel regions" hereinafter refers to regions where the pixel electrodes 9 are disposed. The pixel electrodes 9 are formed in a rectangular shape so as to cover the pixel regions 12 in plan view. The pixel electrodes 9 are formed of a transparent conductive material such as indium tin oxide (ITO).

A light-shielding film (not shown) is disposed in regions (interpixel regions) 14 between the pixel electrodes 9. Grooves 10a (outlined by the broken lines) are disposed in a region where the light-shielding film is disposed. These grooves 10a are formed in a grid pattern so as to extend along the interpixel regions 14 vertically and horizontally in FIG. 3. The vertical grooves 10a cross the horizontal grooves 10a between the corners of the pixel regions 12. The grooves 15a have slightly wider portions around the intersections thereof. In addition, the grooves 10a have a larger cross-sectional area parallel to the TFT array substrate 10 on the opening side of the grooves 10a than on the bottom side thereof. That is, as shown in FIG. 4, the width L of the grooves 10a decreases along the depth D of the grooves 10a from the top surface of the TFT array substrate 10.

The grooves 10a have rectangular flat portions 10b extending from the intersection regions thereof. That is, the flat portions 10b protrude from the grooves 10a to the pixel regions 12. As shown in FIG. 4, for example, the flat portions 10b are positioned at a level that is one step lower than the top surface of the TFT array substrate 10. In plan view, for example, these flat portions 10b overlap the upper and lower left corners of the pixel regions 12 in FIG. 3.

The capacitors 17, the data lines 6a, and the scanning lines 3a are disposed in the grooves 10a and the flat portions 10b thereof. The capacitors 17 are disposed in the wider portions of the grooves 10a so as to extend in two orthogonal directions (in the vertical and horizontal directions in FIG. 3) along wall surfaces of the grooves 10a from the intersection regions thereof. In FIG. 4, for example, the capacitors 17 are mainly composed of capacitor electrodes 17a, insulating films 17c, and capacitor electrodes 17b which are disclosed in the grooves 10a. The capacitors 17 are formed on the wall surfaces of the grooves 10a (including the bottom and side surfaces thereof) so that the capacitors 17 are U-shaped in cross section along the wall surfaces of the grooves 10a.

The capacitor electrodes 17a are disposed on the wall surfaces of the grooves 10a and are formed of thin films of a metal such as titanium, molybdenum, chromium, tungsten, tantalum, or palladium. The insulating films 17c are disposed inside the capacitor electrodes 17a and are formed of an insulating material such as $SiO_2$. Although not illustrated in FIG. 4, the capacitor electrodes 17a are connected to the capacitor lines 4b shown in FIG. 2 so that they are maintained at the same potential.

The capacitor electrodes 17b are metal films disposed inside the insulating films 17c so as to face the capacitor electrodes 17a and are formed of the same material as the capacitor electrodes 17a. The capacitor electrodes 17b are U-shaped in cross section inside the grooves 10a and have flat portions 17d extending over the flat portions 10b of the TFT array substrate 10. These flat portions 17d are disposed above the flat portions 10b of the TFT array substrate 10 and are formed integrally with the capacitor electrodes 17b. The capacitors 17 hold electrical charge between the capacitor electrodes 17a and 17b with the insulating films 17c disposed therebetween.

In FIGS. 4 and 5, the data lines 6a and the scanning lines 3a are disposed inside the capacitors 17 with insulating films 61 disposed therebetween. The data lines 6a are disposed in the vertical grooves 10a in FIG. 3 while the scanning lines 3a are disposed in the horizontal grooves 10a in FIG. 3. The data lines 6a cross the scanning lines 3a in the intersection regions of the grooves 10a to define intersection regions.

The data lines 6a are formed of a metal such as copper, aluminum, silver, gold, nickel, or chromium and extend along the vertical grooves 10a in FIG. 3. The data lines 6a are partially surrounded by the capacitors 17 around the intersections of the grooves 10a.

The data lines 6a are U-shaped in cross section inside the grooves 10a and have flat portions 6b extending over the flat portions 10b of the TFT array substrate 10 so as to overlap the upper left corners of the pixel regions 12 in FIG. 3. That is, the flat portions 6b protrude from the regions of the grooves 10a corresponding to the intersection regions of the data lines 6a and the scanning lines 3a to the pixel regions 12. These flat portions 6b are formed of the same metal as the data lines 6a and are formed Integrally therewith.

The data lines 6a are formed in such a shape that the width thereof (the length in a direction perpendicular to the longitudinal direction thereof) decreases gradually from the opening side of the grooves 10a to the bottom side thereof. The data lines 6a satisfy the following relationship:

$$1 < (Lz/Lw) < 50$$

wherein Lz is the depth of the data lines 6a (the length from the top surface of the TFT array substrate 10 to the bottom of the data lines 6a) and Lw is the width of the data lines 6a. The top surfaces of the data lines 6a and the flat portions 6b thereof are flush with the top surface of the TFT array substrate 10.

The scanning lines 3a are formed of a metal such as copper, aluminum, silver, gold, nickel, or chromium and extend along the horizontal grooves 10a in FIG. 3. The scanning lines 3a are partially surrounded by the capacitors 17 around the intersections of the grooves 10a.

The scanning lines 3a, which are similar in cross-sectional shape to the data lines 6a, are formed in such a shape that the width thereof (the length in a direction perpendicular to the longitudinal direction thereof) decreases gradually from the opening side of the grooves 10a to the bottom side thereof. The scanning lines 3a satisfy the same depth-width relationship as the data lines 6a.

Gate electrodes 3b are disposed in the intersection regions of the data lines 6a and the scanning lines 3a so as to extend along the scanning lines 3a. These gate electrodes 3b are positioned above the top surface of the TFT array substrate 10 (on the liquid crystal layer 50 side). Both ends of each of the gate electrodes 3b are connected to the scanning lines 3a via contact holes 3c.

In the intersection regions of the data lines 6a and the scanning lines 3a, as clearly shown in FIG. 6, the data lines 6a extend through the grooves 10a, and the scanning lines 3a extend across the data lines 6a via the gate electrodes 3b. The scanning lines 3a have substantially the same depth and width as the data lines 6a.

The TFTs 30 have a lightly doped drain (LDD) structure and are mainly composed of semiconductor films 62, insulating films 67, and the gate electrodes 3b. In plan view, the semiconductor films 62 overlap the intersection regions of the data lines 6a and the scanning lines 3a. In FIG. 3, the TFTs 30 are formed in the interpixel regions 14 in a rectangular shape that covers four adjacent corners of the pixel regions 12 and a region surrounded by the corners (intercorner region). In plan view, the corners of the semiconductor films 62 overlap the flat portions 6b of the data lines 6a and the flat portions 17d of the capacitors 17, and the centers of the semiconductor films 62 overlap the gate electrodes 3b. In FIGS. 4 and 5, the gate electrodes 3b are positioned above the semiconductor films 62 with the insulating films 67 disposed therebetween.

The semiconductor films 62 are formed of a semiconductor material such as silicon. The insulating films 67 are thin films disposed above the semiconductor films 62 (on the liquid crystal layer 50 side) and formed of, for example, silicon oxide ($SiO_2$). The semiconductor films 62 each include a channel region 1a, a heavily doped source region 1b, a heavily doped drain region 1c, a lightly doped source region 1d, and a lightly doped drain region 1e.

The channel regions 1a overlap the gate electrodes 3b in plan view (in the centers of the semiconductor films 62 in the vertical direction in FIG. 3). The insulating films 67 are disposed between the channel regions 1a and the gate electrodes 3b. The channel regions 1a serve as switches for allowing transmission of electrical signals from the data lines 6a.

The heavily doped source regions 1b overlap the flat portions 6b of the data lines 6a in plan view (on the bottom side of the semiconductor films 62 in FIG. 3). The heavily doped source regions 1b are electrically connected to the flat portions 6b of the data lines 6a via source contact holes 65.

The heavily doped drain regions 1c overlap the flat portions 17b of the capacitors 17 in plan view (on the top side of the semiconductor films 62 in FIG. 3). The heavily doped drain regions 1c are electrically connected to the pixel electrodes 9 via pixel contact holes 63 and to the flat portions 17b of the capacitors 17 via capacitor contact holes 64. The lightly doped source regions 1d are disposed between the channel regions 1a and the heavily doped source regions 1b. The lightly doped drain regions 1e are disposed between the channel regions 1a and the heavily doped drain regions 1c.

Method for Producing Liquid Crystal Device

An example of a process for producing the liquid crystal device 100 according to the first embodiment of the invention will be described. In this process, liquid crystal devices are simultaneously formed on a large mother substrate before they are separated by cutting.

The liquid crystal device 100 is formed by preparing, stacking, and cutting a mother counter substrate and a mother TFT array substrate. The mother TFT array substrate is a large substrate having rectangular display regions, each corresponding to the TFT array substrate 10. The mother counter substrate is a large substrate having rectangular display regions, each corresponding to the counter substrate 20.

Preparation of the mother TFT array substrate will be described. First, the grooves 10a and the flat portions 10b thereof are formed on a large substrate (TFT array substrate 10) formed of a transparent material such as glass or quartz.

Figure 7:
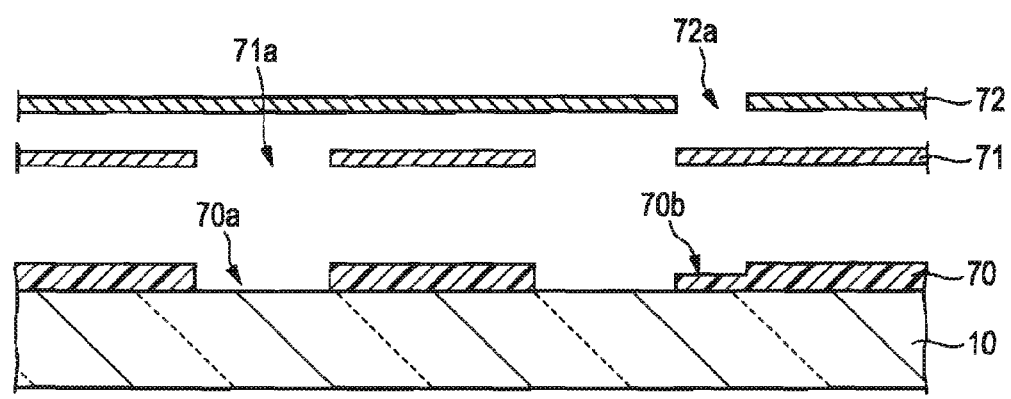
FIG. 7 is a diagram illustrating a step of a process for producing the liquid crystal device according to this embodiment.
Figure 8:
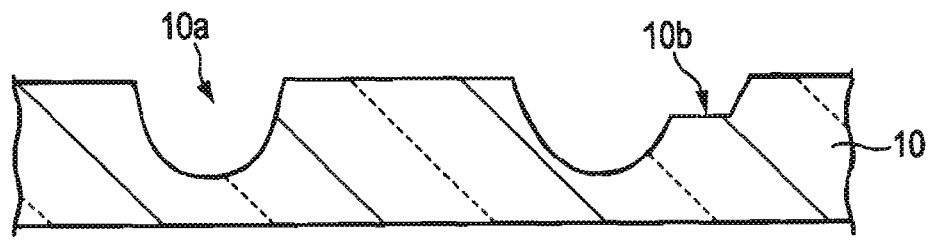
FIG. 8 is a diagram illustrating another step of the process for producing the liquid crystal device according to this embodiment.

A detailed description will be given with reference to FIGS. 7 and 8. A resist layer 70 having a uniform thickness of about 3 μm is formed on the TFT array substrate 10 by, for example, spin coating or spray coating using a resist such as OFPR series (manufactured by Tokyo Ohka Kogyo Co., Ltd.) or AZ series (Clariant Ltd.). The resist layer 70 is covered with a mask 71 before the resist layer 70 is exposed for a predetermined period of time. The resist layer 70 is then covered with another mask 72 before the resist layer 70 is further exposed. The mask 71 has openings 10a corresponding to the grooves 10a of the TFT array substrate 10 while the mask 72 has openings 72a corresponding to the flat portions 10b of the TFT array substrate 10. After the double exposure, the resist layer 70 is subjected to development to form grooves 70a extending through the resist layer 70 and stepped grooves 70b.

The TFT array substrate 10 is subjected to dry etching through the resist layer 70 having the grooves 70a and 70b using an etchant such as $CF$, $C_4F_8$, or $CHF_3$. The etching is performed with the TFT array substrate 10 placed in a chamber having an evacuation system such as a pump. The pressure around the TFT array substrate 10 is reduced to 0.133 to hundreds of pascals. A mixture gas containing the etchant is supplied at about 30 sccm and is excited (into, for example, a radical state) by applying a high-frequency voltage (for example, about 13.56 MHz) to electrodes disposed in the chamber to etch the TFT array substrate 10 with the reactive gas. As shown in FIG. 8, the pattern of the resist layer 70 is transferred to the TFT array substrate 10 to form the grooves 10a and the flat portions 10b thereof.

The inventors have confirmed that the inclination angle of the wall surfaces of the grooves 10a depends on the temperature of the TFT array substrate 10. For example, the inclination angle is 99° at a substrate temperature of 156° C., 85° at a substrate temperature of 46° C., and 78° at a substrate temperature of 9° C. This is because fluorocarbons produced by reaction between carbon and fluorine are deposited on the wall surfaces of the grooves 10a and protect the wall surfaces. Hence, the amount of fluorocarbons deposited may be adjusted by changing the temperature of the TFT array substrate 10 so as to incline the wall surfaces of the grooves 10a to a desired angle.

Figure 9:
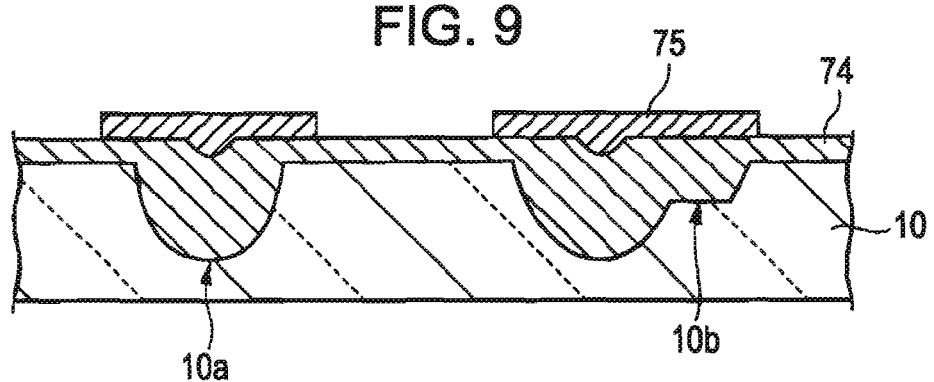
FIG. 9 is a diagram illustrating another step of the process for producing the liquid crystal device according to this embodiment.

Formation of the capacitors 17 on the TFT array substrate 10 having the grooves 10a and the flat portions 10b thereof will be described with reference to FIGS. 9 to 13. First, a metal film 74 is formed on the TFT array substrate 10 so as to cover the top surface, grooves 13a, and flat portions 10b thereof. The metal film 74 is formed of, for example, titanium, molybdenum, chromium, tungsten, tantalum, or palladium. Referring to FIG. 9, a protective layer 75 is formed on portions of the metal film 74 corresponding to the grooves 10a and the flat portions 11b thereof.

The metal film 74 is etched with the protective layer 75 disposed thereon to remove unprotected portions, thus forming the capacitor electrodes 17a in the grooves 1a and on the flat portions 10 thereof. This etching may be performed by the same method described above or wet etching.

Figure 10:
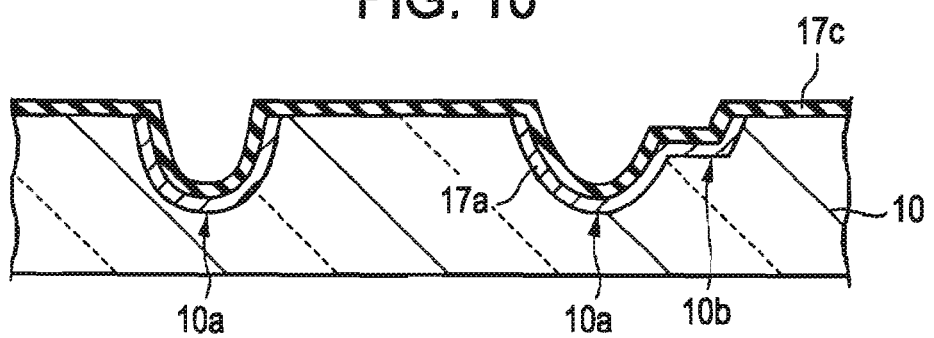
FIG. 10 is a diagram illustrating another step of the process for producing the liquid crystal device according to this embodiment.
Figure 11:
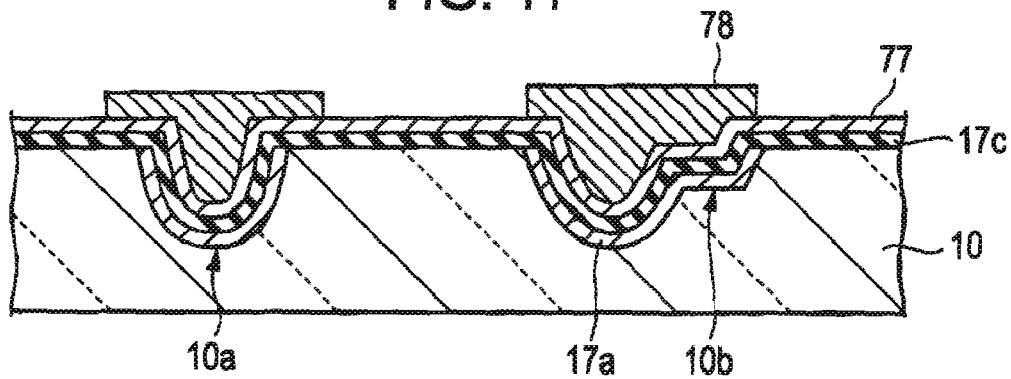
FIG. 11 is a diagram illustrating another step of the process for producing the liquid crystal device according to this embodiment.

Referring to FIG. 10, the insulating film 17c is formed on the top surface of the TFT array substrate 10 and the capacitor electrodes 17a. Referring to FIG. 11, a metal film 77 is formed on the insulating film 17c. This metal film 77 is formed of the same material as the capacitor electrodes 17a, for example, titanium, molybdenum, chromium, tungsten, tantalum, or palladium. After a protective layer 78 is formed above the grooves 10a and the flat portions 10b thereof, the metal film 77 is etched to form the capacitor electrodes 17b in the grooves 11a and form the flat portions 17d of the capacitor electrodes 17b above the flat portions 10b of the TFT array substrate 10.

Figure 12:
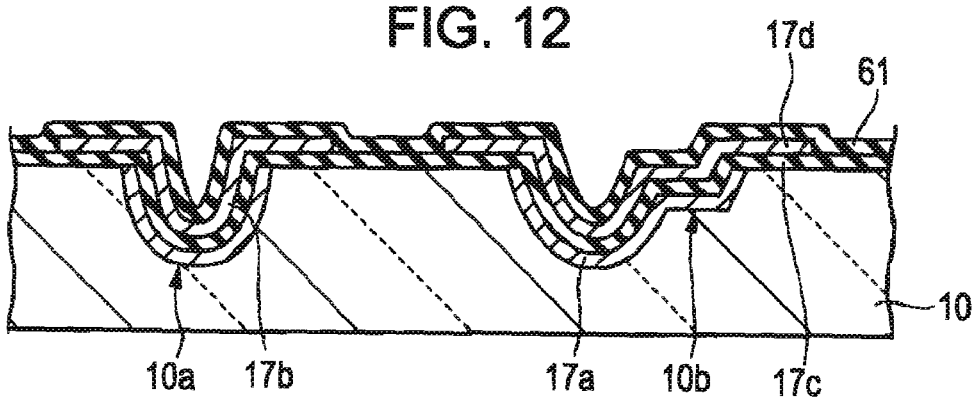
FIG. 12 is a diagram illustrating another step of the process for producing the liquid crystal device according to this embodiment.
Figure 13:
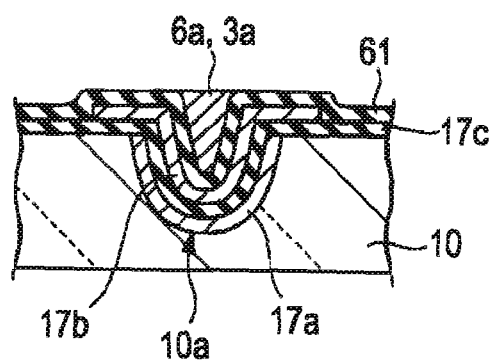
FIG. 13 is a diagram illustrating another step of the process for producing the liquid crystal device according to this embodiment.

Referring to FIG. 12, the insulating film 61 is formed on the top surface of the TFT array substrate 1u and the capacitor electrodes 17b. Referring to 13, the data lines 6a are formed in the grooves 10a covered with the insulating film 61. The data lines 6a are formed of a metal such as copper, aluminum, silver, gold, nickel or chromium. The scanning lines 3a are similarly formed. Subsequently, unnecessary portions are removed from the TFT array substrate 10, and the substrate 10 is planarized.

After the grooves 10a, the flat portions 10b thereof, the capacitors 17, the data lines 6a, and the scanning lines 3a are formed on the TFT array substrate 10, the contact holes 64 and 65 are formed, and the semiconductor films 62 are formed so as to be connected to the contact holes 64 and 65. The insulating films 67 are then formed on the semiconductor films 62, and the gate electrodes 3b are formed on the insulating films 67 so as to be connected to the scanning lines 3a. The contact holes 63 are formed in the insulating films 67, and the pixel electrodes 9 are formed so as to be connected to the contact holes 63. The alignment film 16 is formed on the top surface of the TFT array substrate 10, and the seal 42 is formed on the alignment film 16.

Preparation of the mother counter substrate will be briefly described. The mother counter substrate is a large substrate, similar to the mother TFT array substrate, formed of a transparent material such as glass or quartz. The common electrode 21 is formed in display regions of the mother counter substrate, and the alignment film 22 is formed on the common electrode 21.

The mother TFT array substrate and the mother counter substrate are stacked and bonded with the seal 42 disposed therebetween. The seal 42 is then cured by ultraviolet (UNT) exposure.

Scribe lines are formed on the mother TFT array substrate and the mother counter substrate before they are cut along the scribe lines to separate individual liquid crystal panels. These panels are washed, and a liquid crystal is sealed into the panels. Flexible circuit boards, for example, are mounted on the panels with anisotropic conductive films (ACFs) disposed therebetween. The liquid crystal device 100 is thus completed.

According to this embodiment, the grooves 10a are disposed in the top surface of the TFT array substrate 10 so as to extend along the interpixel regions 14. The capacitors 17, the data lines 6a, and the scanning lines 3a can be partially disposed in the grooves 10a so that they occupy smaller areas in the interpixel regions 14. Accordingly, the size of the liquid crystal device 100 can be reduced, and the area of the pixel regions 12 can be increased relative to that of the interpixel regions 14. Thus, this structure contributes to size reduction and higher definition and can also significantly increase the aperture ratio of the pixel regions 12.

In addition, the liquid crystal device 100 has increased light resistance because the areas of the capacitors 17, the data lines 6a, and the scanning lines 3a in the interpixel regions 14 can be reduced to inhibit light reflection/absorption leading to an increase in the temperature of the liquid crystal device 100. Furthermore, the data lines 6a and the scanning lines 3a can be extended along the depth of the grooves 10a to increase the cross-sectional area of the data lines 6a and the scanning lines 3a. This allows for a reduction in the resistance of the data lines 6a and the scanning lines 3a for efficient signal transmission.

Figure 14:
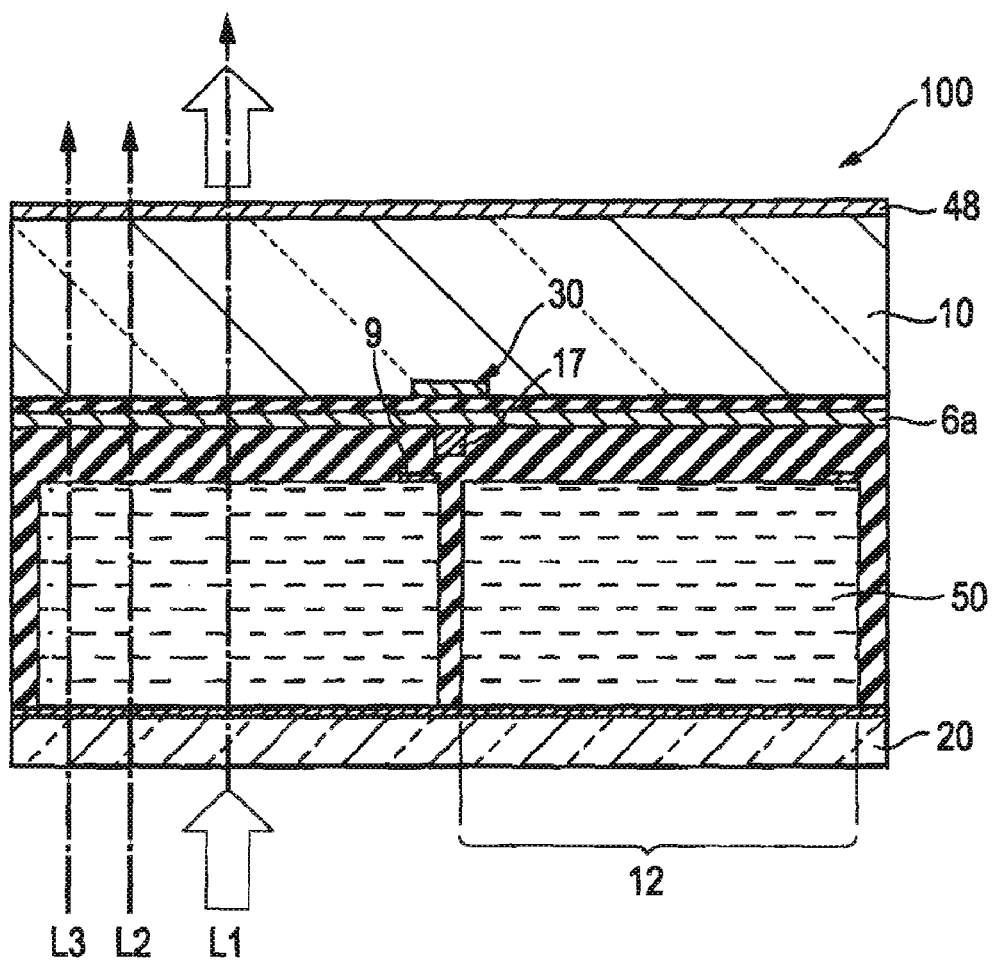
FIG. 14 is a sectional view showing transmission of light through the liquid crystal device.

In this embodiment, additionally, the TFTs 30 are disposed between the corners of the pixel regions 12 so as to overlap them in plan view. Referring to FIG. 14, a voltage can be stably applied between the pixel electrodes 9 and the common electrode 21 to reliably align the light crystal in the centers of the pixel regions 12. Central light L1 passing through the centers of the pixel regions 12 therefore reliably undergoes a predetermined amount of phase shift (substantially 90°). The central light L1 can thus be transmitted through a polarizer with high transmittance to provide clear black or white display and high contrast.

On the other hand, the voltage is less stably applied in the peripheries of the pixel regions 12, including the corners of the pixel regions 12, than in the centers of the pixel regions 12, and thus the liquid crystal is less reliably aligned in the peripheries of the pixel regions 12. Light passing therethrough can therefore fail to reach the predetermined amount of phase shift. For example, peripheral light L2 passing through the peripheries of the pixel regions 12 undergoes a phase shift of only about 60°, and peripheral light L3 passing through the corners of the pixel regions 12 undergoes a phase shift of only about 45°. The peripheral light L2 and the peripheral light L3 are thus transmitted through the polarizer with lower transmittance than the central light L1. This results in unclear black or white display and low contrast.

In this embodiment, the intensity of the central light L1 can be increased because the total aperture ratio of the pixel regions 12 is increased relative to that of pixel regions of a known liquid crystal device. Accordingly, the intensity of the central light L1, which contributes to higher contrast, is increased while the peripheral light L2, which contributes to lower contrast, is blocked by the TFTs 30. The liquid crystal device 100 thus allows high-contrast light to pass through the polarizer with higher transmittance than the known liquid crystal device to provide higher contrast.

In this embodiment, additionally, the data lines 6a and the scanning lines 3a satisfy the depth-width relationship described above, namely, 1<(Lz/Lw)<50, so that they can have a cross-sectional area sufficient to supply the current required for driving the TFTs 30 even for smaller line widths.

In this embodiment, additionally, the capacitors 17 overlap the data lines 6a (scanning lines 3a) in plan view. The capacitors 17 and the data lines 6a (scanning lines 3a, can thus be stacked in layers to facilitate the preparation of the TFT array substrate 10.

Second Embodiment

A second embodiment of the invention will be described with reference to the drawings, where the individual components are illustrated on different scales if necessary for convenience of illustration, as in the first embodiment. This embodiment is different from the first embodiment in that data lines are disposed inside grooves while scanning lines are disposed outside the grooves. The description below will focus on this point.

Figure 15:
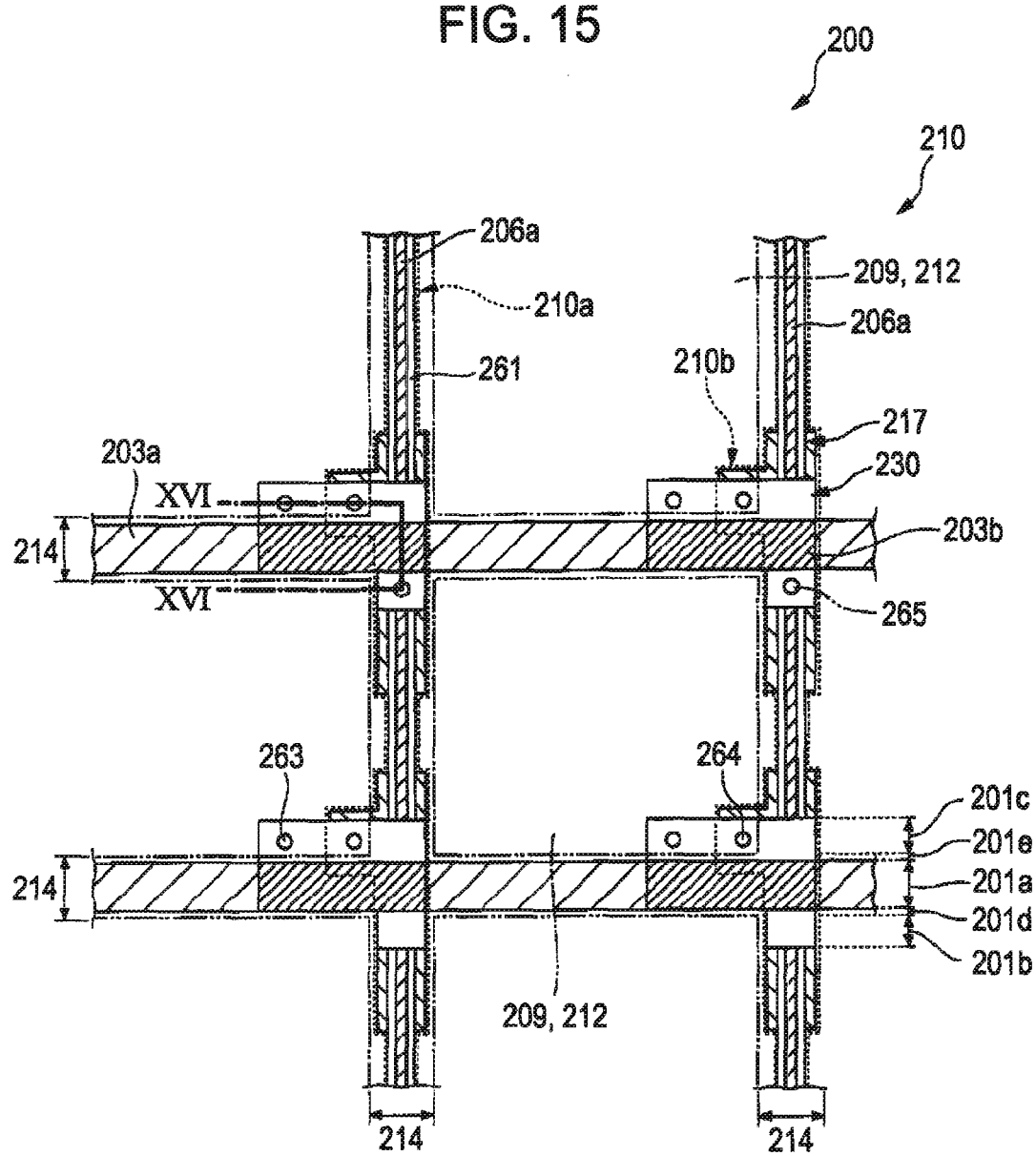
FIG. 15 is a plan view of a liquid crystal device according to a second embodiment of the invention.
Figure 16:
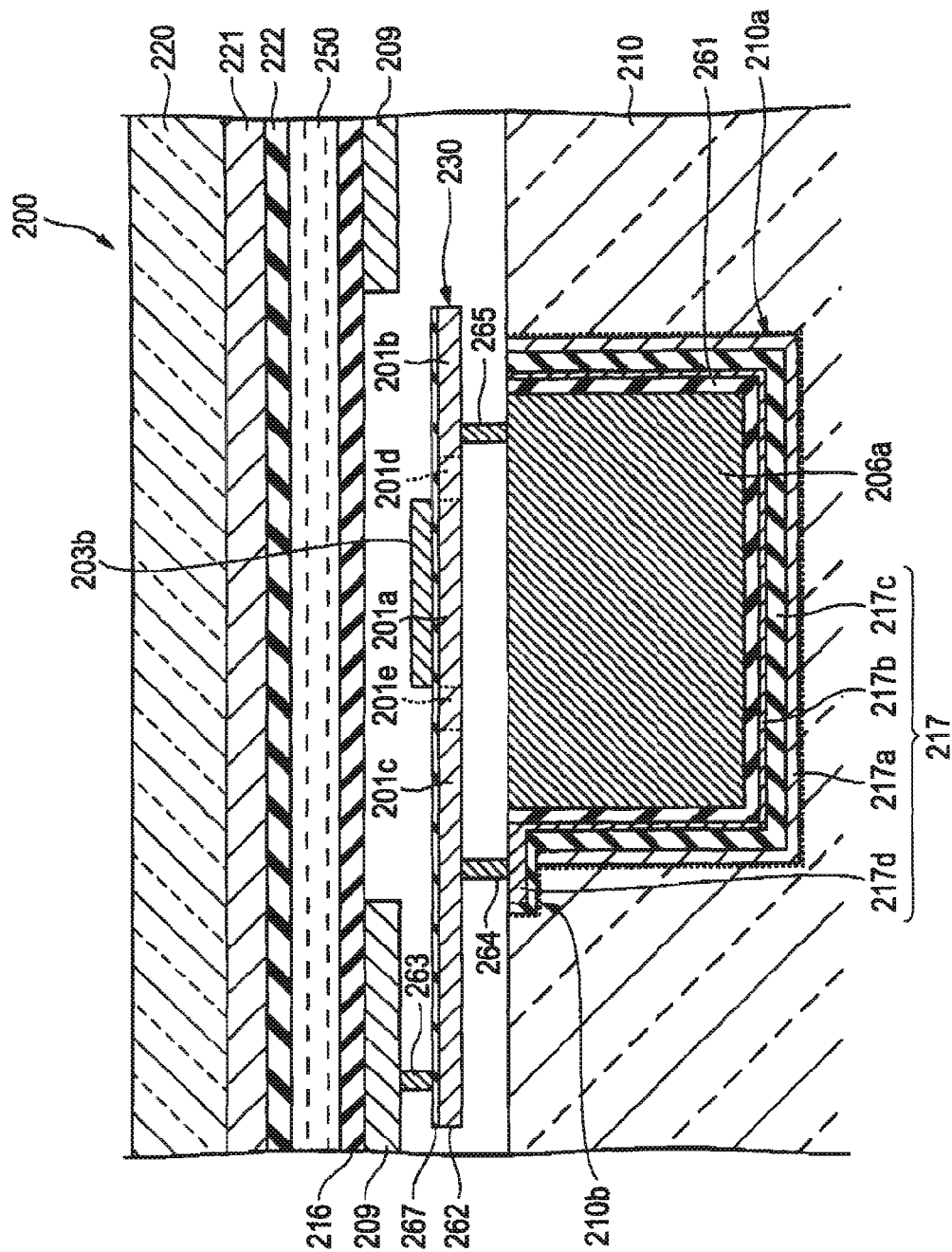
FIG. 16 is a sectional view of the liquid crystal device according to this embodiment.

FIG. 15 is a plan view of a TFT array substrate 210 of a liquid crystal device 200 according to this embodiment. In FIG. 15, as in the first embodiment, the vertical direction corresponds to the lateral direction of the TFT array substrate 210, and the horizontal direction corresponds to the longitudinal direction of the TFT array substrate 210. FIG. 16 is a sectional view taken along line XVI-XVI of FIG. 15.

In FIG. 15, a light-shielding film (not shown) is disposed in Interpixel regions 214. Grooves 210a (outlined by the broken lines) are disposed in a region where the light-shielding film is disposed. These grooves 210a are formed in a stripe pattern so as to extend along the interpixel regions 214 vertically in FIG. 15. In this embodiment, only the vertical grooves 210a are formed, and no horizontal grooves are formed. In FIG. 16, additionally, the grooves 210a have a uniform width over the depth thereof from the opening side to the bottom side. The grooves 210a have flat portions 210b overlapping the lower right corners of pixel regions 212 in FIG. 15. The flat portions 210b protrude from the grooves 210a to the left adjacent pixel regions 212.

Capacitors 217, data lines 206a, scanning lines 203a, and TFTs 230 are disposed in the interpixel regions 214. Among them, the data lines 206a and the capacitors 217 are disposed in the grooves 210a. Specifically, the capacitors 17 are disposed in wider portions of the grooves 210a so as to extend along wall surfaces thereof. In FIG. 16, for example, the capacitors 217 are mainly composed of capacitor electrodes 217a, insulating films 217c, and capacitor electrodes 217b which are disposed in the grooves 210a. The capacitor electrodes 217b have flat portions 217d extending over the flat portions 210b of the TFT array substrate 210. The capacitors 217 are formed on the wall surfaces of the grooves 210a so that the capacitors 217 are box-shaped in cross section along the wall surfaces of the grooves 210a.

The data lines 206a are surrounded by the capacitors 217 and have a uniform width over the depth thereof. The data lines 206a satisfy the following relationship:

0.5<(Lz/Lw)<15 wherein Lz is the depth of the data lines 206a and Lw is the width of the data lines 206a. The top surfaces of the data lines 206a are flush with the top surface of the TFT array substrate 210.

The scanning lines 203a extend horizontally in FIG. 15 along the interpixel regions 214. Portions of the scanning lines 3a which cross the data lines 206a serve as gate electrodes 203b. The scanning lines 203a are positioned above the top surface of the TFT array substrate 10 (on the liquid crystal layer 250 side). In this embodiment, there is no difference between the heights of the scanning lines 203a and the gate electrodes 203b from the top surface of the TFT array substrate 210. The gate electrodes 203b are composed of portions of the scanning lines 3a which overlap the TFTs 230 in plan view; that is, the gate electrodes 3b constitute part of the scanning lines 3a.

The TFTs 230, as in the first embodiment, have an LDD structure and are mainly composed of semiconductor films 262, insulating films 267, and the gate electrodes 203b. In FIG. 15, the semiconductor films 262 and the insulating films 267 are formed in an inversed L shape in regions including the regions between the corners of the pixel regions 212 so as to overlap the lower right corners of the pixel regions 212, the data lines 6a, and the flat portions 217d of the capacitors 217 in plan view. The centers of the semiconductor films 262 overlap the gate electrodes 203b in plan view. In FIG. 16, the gate electrodes 203b are positioned above the semiconductor films 262 with the insulating films 267 disposed therebetween.

The semiconductor films 262 each include a channel region 201a, a heavily doped source region 201b, a heavily doped drain region 201c, a lightly doped source region 201d, and a lightly doped drain region 201e. The channel regions 201a overlap the gate electrodes 203b in plan view (in the centers of the semiconductor films 262 in the vertical direction in FIG. 15). The insulating films 267 are disposed between the channel regions 201a and the gate electrodes 203b.

The heavily doped source regions 201b overlap the data lines 206a in plan view (on the bottom side of the semiconductor films 262 in FIG. 15). The heavily doped source regions 201b are directly connected to the data lines 206a via source contact holes 265. Unlike the first embodiment, the heavily doped source regions 201b do not overlap the pixel regions 212 in plan view, and the aperture ratio of the pixel regions 212 can be increased accordingly.

The heavily doped drain regions 201c overlap the flat portions 217b of the capacitors 217 in plan view (on the top side of the semiconductor films 262 in FIG. 15). The heavily doped drain regions 201c are electrically connected to the pixel electrodes 209 via pixel contact holes 263 and to the flat portions 217b of the capacitors 217 via capacitor contact holes 264. The lightly doped source regions 201d are disposed between the channel regions 201a and the heavily doped source regions 201b. The lightly doped drain regions 201e are disposed between the channel regions 201a and the heavily doped drain regions 201c.

This embodiment provides the same advantages as the first embodiment even if only the grooves 210a extending in the lateral direction of the TFT array substrate 210 are formed thereon and no grooves extending in the longitudinal direction are formed. According to this embodiment, additionally, the gate electrodes 3b can be formed as part of the scanning lines 3a to facilitate formation of the gate electrodes 3b.

In this embodiment, additionally, the heavily doped source regions 201b of the semiconductor films 262 overlap the data lines 206a in plan view and are directly connected thereto. This structure can eliminate the need for providing connecting portions between the heavily doped source regions 201b and the data lines 206a to increase the area of the pixel regions 212 and thus the aperture ratio thereof.

In this embodiment, additionally, the data lines 206a satisfy the depth-width relationship described above, namely, 0.5<(Lz/Lw)<15, so that they can have a cross-sectional area sufficient to supply the current required for driving the TFTs 230 even for smaller line widths.

Third Embodiment

A third embodiment of the invention will be described with reference to the drawings, where the Individual components are illustrated on different scales if necessary for convenience of illustration, as in the first embodiment. This embodiment is different from the first embodiment in the structure of semiconductor films of TFTs. The description below will focus on this point.

Figure 17:
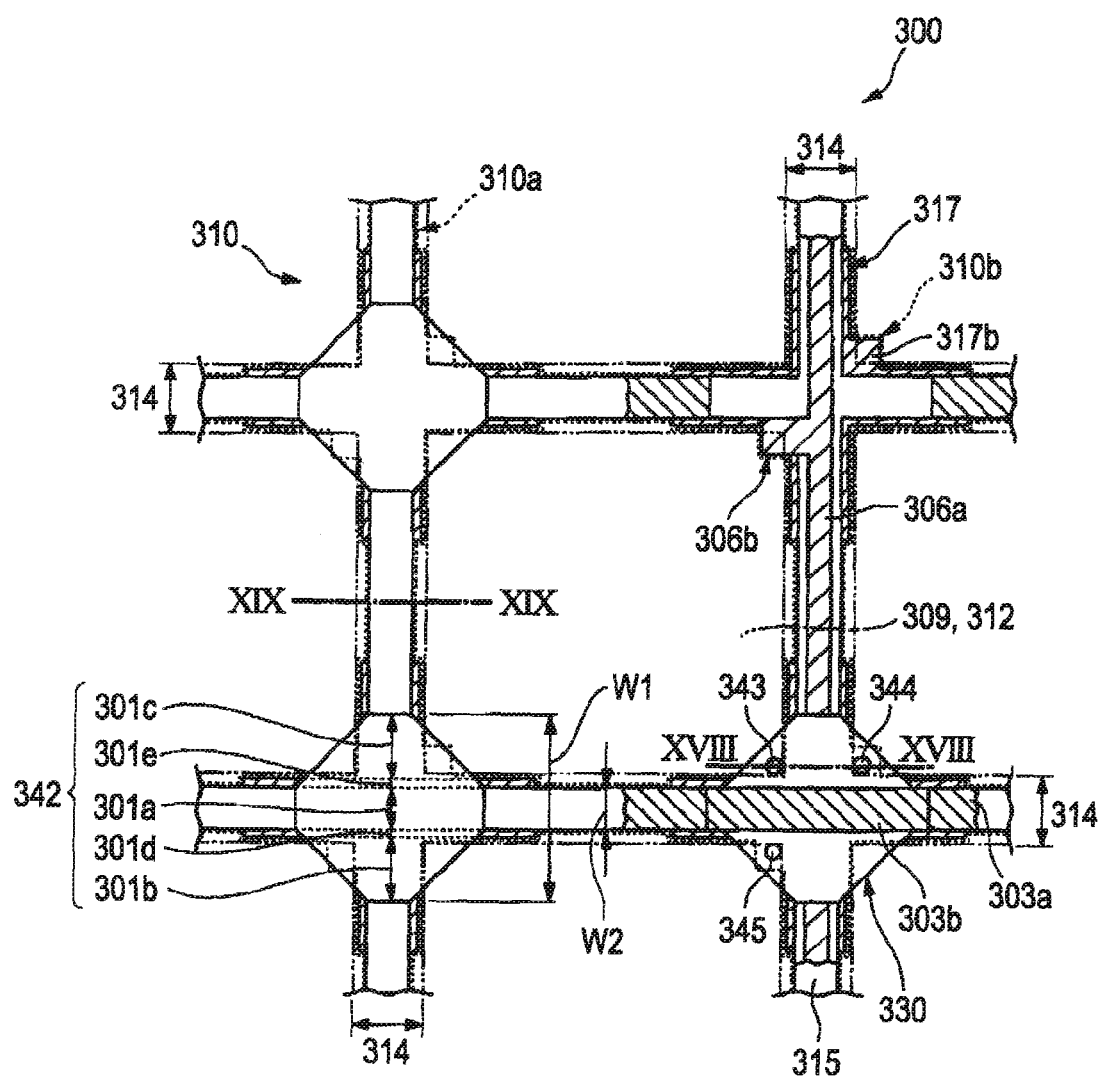
FIG. 17 is a plan view of a liquid crystal device according to a third embodiment of the invention.
Figure 18:
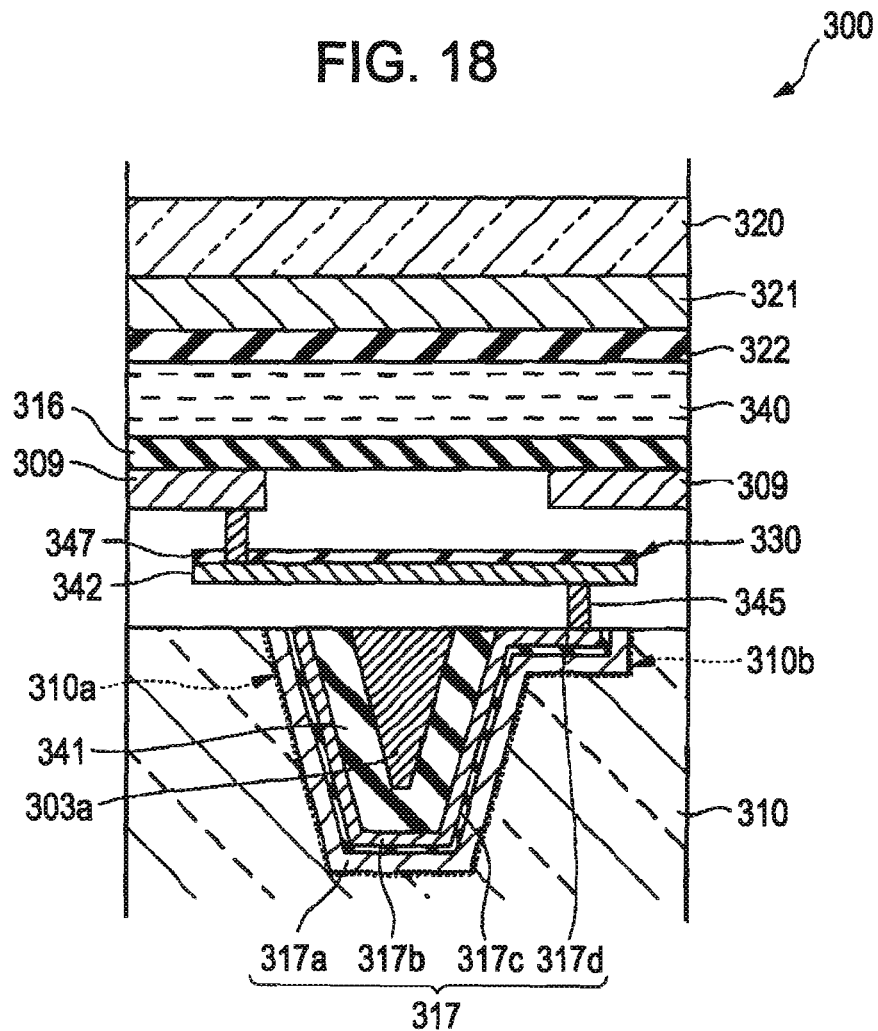
FIG. 18 is a sectional view of the liquid crystal device according to this embodiment.
Figure 19:
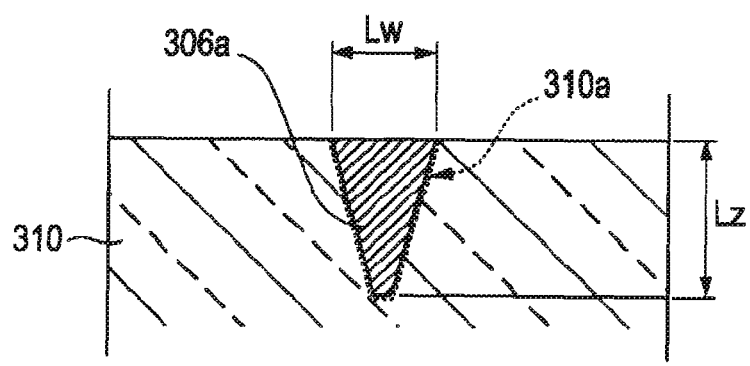
FIG. 19 is another sectional view of the liquid crystal device according to this embodiment.

FIG. 17 is a plan view of a TFT array substrate 310 of a liquid crystal device 300 according to this embodiment. In FIG. 17, as in the first embodiment, the vertical direction corresponds to the lateral direction of the TFT array substrate 310, and the horizontal direction corresponds to the longitudinal direction of the TFT array substrate 310. FIG. 18 is a sectional view taken along line XVIII-XVIII of FIG. 17. FIG. 19 is a sectional view taken along line XIX-XIX of FIG. 18.

In FIG. 17, a light-shielding film 315 is disposed in interpixel regions 314. Grooves 310a are disposed in a region where the light-shielding film 315 is disposed (the light-shielding film 315 is partially omitted for convenience of illustration) The width of the light-shielding film 315 in the vertical direction in FIG. 17 is substantially the same as that of the light-shielding film 315 in the horizontal direction.

The grooves 310a are formed in a grid pattern so as to extend along the interpixel regions 314 vertically and horizontally in FIG. 17. The vertical grooves 310a cross the horizontal grooves 310a between the corners of pixel regions 312. The width of the grooves 310a decreases along the depth thereof at a constant rate.

The grooves 310a have rectangular flat portions 310b in intersection regions thereof. That is, the flat portions 310b protrude from the intersection regions of the grooves 310a to the pixel regions 312. In plan view, for example, these flat portions 310b overlap the upper right and lower left corners of the pixel regions 312 in FIG. 17.

Capacitors 317, data lines 306a, scanning lines 303a, and TFTs 330 are disposed in the interpixel regions 314. Among them, the data lines 306a, the scanning lines 303a, and the capacitors 317 are disposed in the grooves 310a. The data lines 306a cross the scanning lines 303a at the intersections of the grooves 310a to define intersection regions. The capacitors 17 are disposed in wider portions of the grooves 310a so as to extend along wall surfaces thereof. In FIG. 18, for example, the capacitors 317 are mainly composed of capacitor electrodes 317a, insulating films 317c, and capacitor electrodes 317b which are disposed in the grooves 310a. The capacitor electrodes 317b have flat portions 317d extending over the flat portions 310b of the TFT array substrate 310. The capacitors 317 are formed along the wall surfaces of the grooves 310a.

The data lines 306a extend vertically in FIG. 17 along the vertical grooves 310a. As shown in FIGS. 18 and 19, the data lines 306a are formed along the cross-sectional shape of the grooves 310a so that the width of the data lines 306a decreases at a constant rate along the depth from the top surface of the TFT array substrate 310 (trapezoidal 4n FIG. 18). In addition, the data lines 306a satisfy the following relationship:

$$0.5 < (Lz/Lw) < 15$$

wherein Lz is the depth of the data lines 306a and Lw is the width of the data lines 306a. The data lines 306a have flat portions 306b extending from the regions of the grooves 310a corresponding to the intersection regions of the data lines 306a and the scanning lines 303a.

The scanning lines 303a extend horizontally in FIG. 17 along the horizontal grooves 310a. The scanning lines 303a are formed in the same cross-sectional shape as the data lines 306a, that is, formed along the cross-sectional shape of the grooves 310a so that the width of the scanning lines 303a decreases at a constant rate along the depth from the top surface of the TFT array substrate 310 (trapezoidal in FIG. 18). The scanning lines 303a have substantially the same depth and width as the data lines 300a and thus satisfy the same depth-width relationship as the data lines 306a.

Gate electrodes 303b are disposed in the intersection regions of the data lines 306a and the scanning lines 303a so as to extend along the scanning lines 303a. These gate electrodes 303b are positioned above the top surface of the TFT array substrate 310 (on the liquid crystal layer 340 side). Both ends of each of the gate electrodes 303b are connected to the scanning lines 303a via, for example, contact holes. The top surfaces of the data lines 306a, the flat portions 306b thereof, and the scanning lines 303a are flush with the top surface of the TFT array substrate 310.

The TFTs 330 are mainly composed of semiconductor films 342, insulating films 347, and the gate electrodes 303b. In plan view, the semiconductor films 342 and the insulating films 347 overlap the intersection regions of the data lines 306a and the scanning lines 303a and are formed in an octagonal shape that covers regions surrounded by the corners of the pixel regions 312.

In plan view, specifically, the semiconductor films 342 are formed so as to overlap the corners of the pixel regions 312 in triangular regions and also cover the flat portions 306b of the data lines 306a and the flat portions 317d of the capacitors 317. The centers of the semiconductor films 342 overlap the gate electrodes 303b in plan view. The light-shielding film 315 includes light-shielding portions covering the semiconductor films 342. These light-shielding portions satisfy the following relationship:

$$W1 \times 0.8 > W2$$

wherein W1 is the maximum width of the light-shielding portions and W2 is the width of the data lines 306a and the scanning lines 303a.

The semiconductor films 342 each include a channel region 301a, a heavily doped source region 301b, a heavily doped drain region 301c, a lightly doped source region 301d, and a lightly doped drain region 301e. The channel regions 301a overlap the gate electrodes 303b in plan view. The heavily doped source regions 301b overlap the flat portions 306b of the data lines 306a in plan view and are connected thereto via source contact holes 345. The heavily doped drain regions 301c overlap the flat portions 317b of the capacitors 317 in plan view and are connected to the pixel electrodes 309 via pixel contact holes 343 and to the flat portions 317b of the capacitors 317 via capacitor contact holes 344. The lightly doped source regions 301d are disposed between the channel regions 301a and the heavily doped source regions 301b. The lightly doped drain regions 301e are disposed between the channel regions 301a and the heavily doped drain regions 301c.

In this embodiment, the semiconductor films 342 are formed in an octagonal shape so that the area where the semiconductor films 342 overlap the pixel regions 212 in plan view can be minimized with the maximum width W1 of the light-shielding portions being smaller than the width W2 of the data lines 306a and the scanning lines 303a. This allows for a further increase in the aperture ratio of the pixel regions 312.

In this embodiment, additionally, the data lines 306a and the scanning lines 303a satisfy the depth-width relationship described above, namely, 0.5<(Lz/Lw)<15, so that they can have a cross-sectional area sufficient to supply the current required for driving the TFTs 330 even for smaller line widths.

In this embodiment, additionally, the grooves 310a, the light-shielding film 315, the data lines 306a, and the scanning lines 303a are formed so as to satisfy the width relationship described above, namely, W1×0.8>W2. This allows for a reduction in the space occupied by the data lines 306a, the scanning lines 303a, and the capacitors 317 to increase the aperture ratio of the pixel regions 312.

Fourth Embodiment

A fourth embodiment of the invention will be described with reference to the drawings, where the individual components are illustrated on different scales if necessary for convenience of illustration, as in the first embodiment. This embodiment is different from the first embodiment in the structure of semiconductor films of TFTs. The description below will focus on this point.

Figure 20:
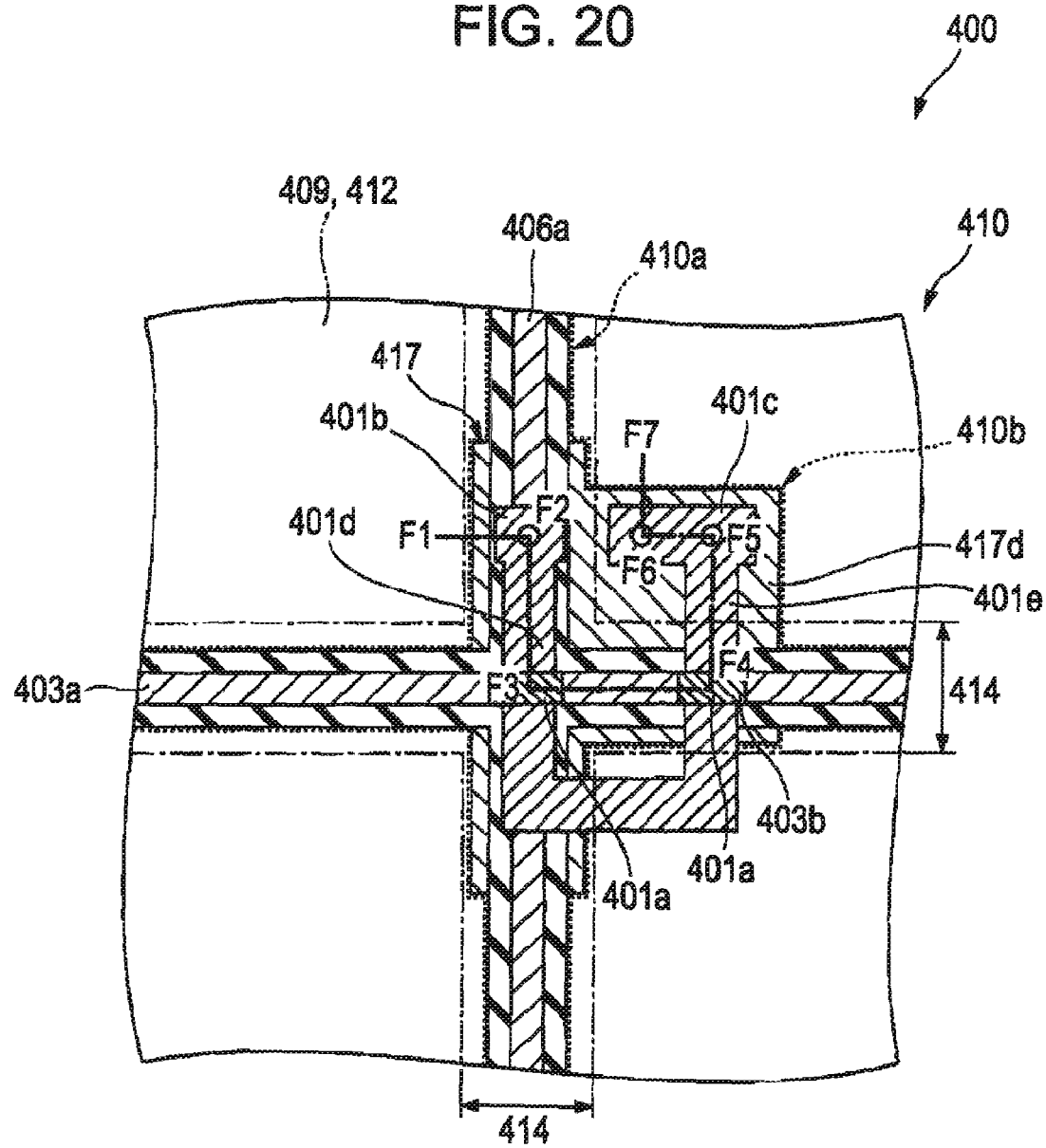
FIG. 20 is a plan view of a liquid crystal device according to a fourth embodiment of the invention.
Figure 21:
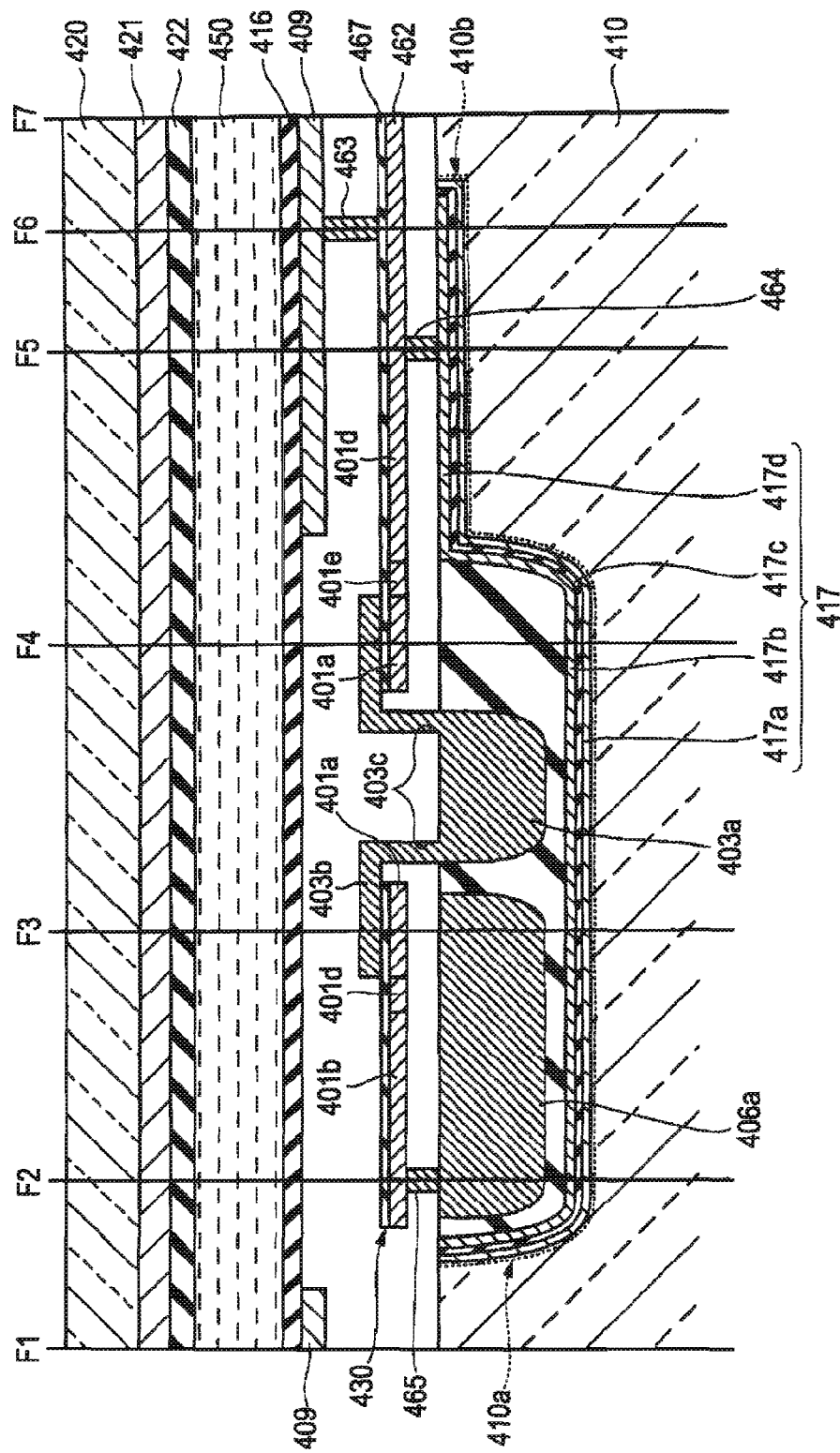
FIG. 21 is a sectional view of the liquid crystal device according to this embodiment.

FIG. 20 is a plan view of a TFT array substrate 410 of a liquid crystal device 400 according to this embodiment. In FIG. 20, as in the first embodiment, the vertical direction corresponds to the lateral direction of the TFT array substrate 410, and the horizontal direction corresponds to the longitudinal direction of the TFT array substrate 410. FIG. 21 is a sectional view taken along line F1-F7 of FIG. 20.

In FIG. 20, a light-shielding film (not shown) is disposed in Interpixel regions 414. Grooves 410a are disposed in a region where the light-shielding film is disposed. The grooves 410a are formed in a grid pattern so as to extend along the interpixel regions 414 vertically and horizontally in FIG. 20. The grooves 410a have rectangular flat portions 410b protruding from intersection regions thereof. In plan view, for example, these flat portions 410b overlap the lower left corners of pixel regions 412 in FIG. 20.

The data lines 406a are disposed in the vertical grooves 410a in FIG. 20 and are formed in substantially the same cross-sectional shape as those in the first embodiment. The data lines 406a satisfy the same depth-width relationship as in the first embodiment. Scanning lines 403a are disposed in the interpixel regions 414 so as to extend horizontally in FIG. 20. Gate electrodes 403b are disposed in intersection regions of the data lines 406a and the scanning lines 403a. The scanning lines 403a have substantially the same depth and width as the data lines 406a.

In FIG. 21, the gate electrodes 403b are positioned above the top surface of the TFT array substrate 410 (on the liquid crystal layer 450 side). Both ends of each of the gate electrodes 403b are connected to the scanning lines 403a via contact holes 403c. The top surfaces of the data lines 406a and the scanning lines 403a are flush with the top surface of the TFT array substrate 410.

Capacitors 417 are mainly composed of capacitor electrodes 417a, insulating films 417c, and capacitor electrodes 417b, and flat portions 417d. The materials, planar structure, and cross-sectional structure of the capacitors 417 are substantially the same as those in the first embodiment, and thus no description will be given here.

TFTs 430 are mainly composed of semiconductor films 462, insulating films 467, and the gate electrodes 403b. In FIG. 20, the semiconductor films 462 are formed in a box shape so as to overlap regions surrounded by the corners of pixel regions 412. That is, the semiconductor films 462 are formed in a box shape having an opening on the upper side of FIG. 20.

In plan view, the semiconductor films 462 overlap flat portions 406b of the data lines 406a and the flat portions 417d of the capacitors 417, and the centers of the semiconductor films 462 overlap the gate electrodes 403b. In FIG. 21, the gate electrodes 403b are positioned above the semiconductor films 462 with the insulating films 467 disposed therebetween.

The semiconductor films 462 each include a channel region 401a, a heavily doped source region 401b, a heavily doped drain region 401c, a lightly doped source region 401d, and a lightly doped drain region 401e. The channel regions 401a overlap the gate electrodes 403b in plan view. The heavily doped source regions 401b overlap the data lines 406a in plan view and are directly connected thereto via source contact holes 465. The heavily doped drain regions 401c overlap the flat portions 417b of the capacitors 417 in plan view and are electrically connected to the pixel electrodes 409 via pixel contact holes 463 and to the flat portions 417b of the capacitors 417 via capacitor contact holes 464. The lightly doped source regions 401d are disposed between the channel regions 401a and the heavily doped source regions 401b. The lightly doped drain regions 401e are disposed between the channel regions 401a and the heavily doped drain regions 401c.

In this embodiment, the semiconductor films 462 are formed in a box shape so that the area where the semiconductor films 462 overlap the pixel regions 412 in plan view can be minimized to further increase the aperture ratio of the pixel regions 412. In this embodiment, additionally, the heavily doped source regions 401b of the semiconductor films 462 overlap the data lines 406a in plan view and are directly connected thereto. This structure can eliminate the need for providing connecting portions between the heavily doped source regions 401b and the data lines 406a to increase the area of the pixel regions 412 and thus the aperture ratio thereof.

Fifth Embodiment

A fifth embodiment of the invention will be described with reference to the drawings, where the individual components are illustrated on different scales if necessary for convenience of illustration, as in the first embodiment. This embodiment is different from the first embodiment in that a microlens array is provided. The description below will focus on this point.

Figure 22:
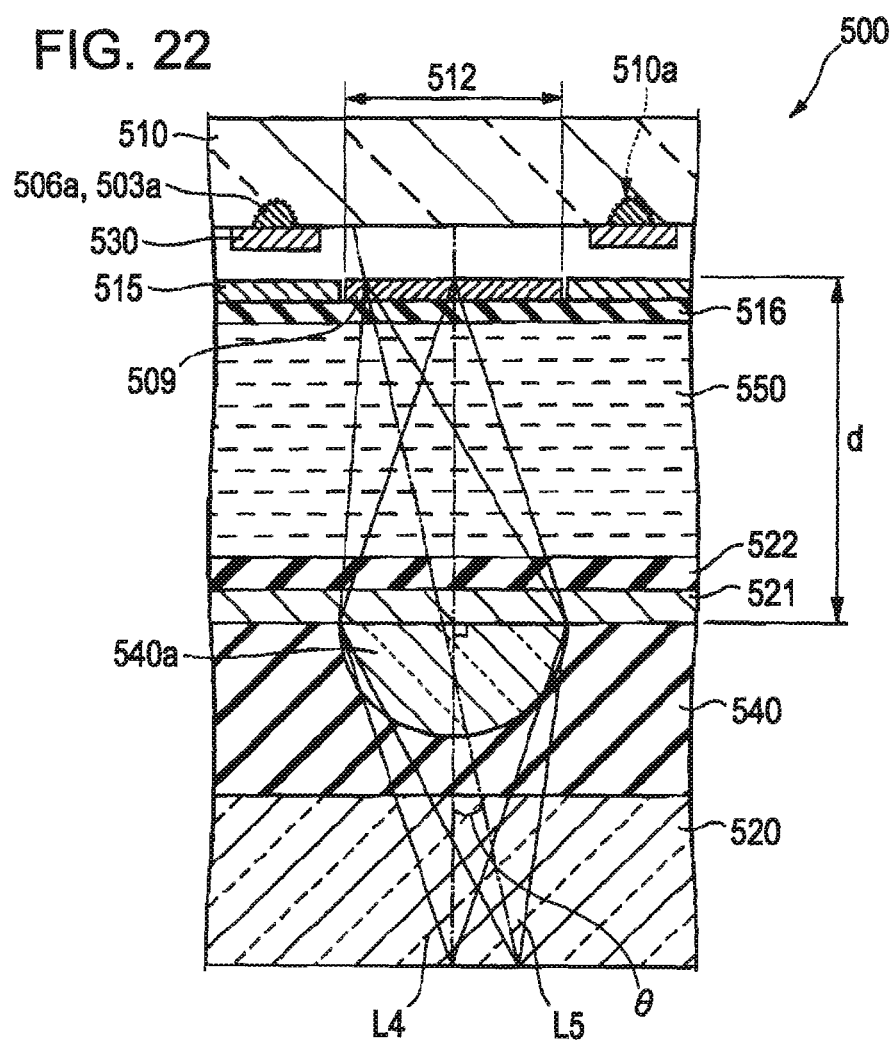
FIG. 22 is a sectional view of a liquid crystal device according to a fifth embodiment of the invention.
Figure 23:
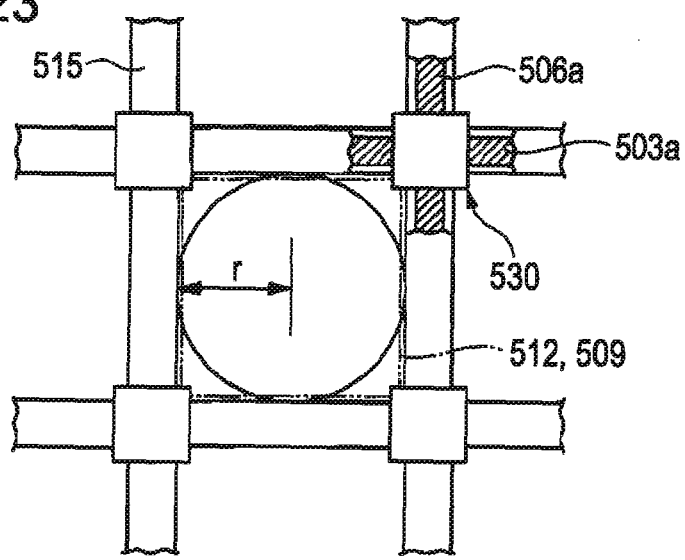
FIG. 23 is a plan view of the liquid crystal device according to this embodiment.

FIG. 22 is a sectional view of a liquid crystal device 500 according to this embodiment. FIG. 23 is a plan view of pixel regions of the liquid crystal device 500. In FIG. 22, the liquid crystal device 500 includes a TFT array substrate 510 and a counter substrate 520 which are stacked and bonded with a liquid crystal layer 550 sealed therebetween using a seal (not shown). A pixel display region of the liquid crystal device 500 includes pixel regions 512 arranged in a matrix.

Grooves 510a are disposed in interpixel regions of an inner surface of the TFT array substrate 510 (on the liquid crystal layer 550 side). Data lines 506a and scanning lines 503a, for example, are disposed in the grooves 510a and are connected to TFTs 530. In FIG. 23, the TFTs 530 overlap the corners of the pixel regions 512 in plan view. For example, the structures of the grooves 510a plan data lines 506a, the scanning lines 503a, and the TFTs 530 are substantially the same as those in any of the first to fourth embodiments. Pixel electrodes 509 are arranged in the pixel regions 512 of the inner surface of the TFT array substrate 510. A light-shielding film 515 is disposed in the interpixel regions. For example, the light-shielding film 515 is positioned closer to the liquid crystal layer 550 than the TFTs 530 to prevent light from the counter substrate 520 from impinging on the TFTs 530. An alignment film 516 is disposed over the pixel electrodes 509 and the light-shielding film 515.

A microlens array 540 is disposed on the inner surface of the counter substrate 520. The microlens array 540 includes lens portions 540a arranged in the pixel regions 512. The lens portions 540a are separated from the pixel electrodes 509 by a distance of d, for example, 15 μm. A common electrode 521 is disposed over the entire inner surface of the microlens array 540, and another alignment film 522 is disposed over the common electrode 521. FIG. 22 shows one of the pixel regions 512 (pixel electrodes 509).

Light entering the liquid crystal device 500 will be described. In FIG. 22, for example, light L4 entering substantially the center of the pixel region 512 perpendicularly to the surface of the counter substrate 520 is collected into substantially the center of the pixel electrode 509 by the lens portion 540a. Light L5 entering the same region at a certain angle θ with respect to the surface of the counter substrate 520 is collected into a region separated from the center of the pixel electrode 509 by a distance of r by the lens portion 540a. In FIG. 23, accordingly, the lens portion 540a collects light into a circular region centered at the center of the pixel electrode 509 and having a radius of r. If the angle θ is 12°, for example, the radius r is about 3.2 μm. The pixel region 512, which is square in FIG. 23, may also be rectangular, and the region where light is collected, which is circular in FIG. 23, may also be elliptical.

Figure 24B:
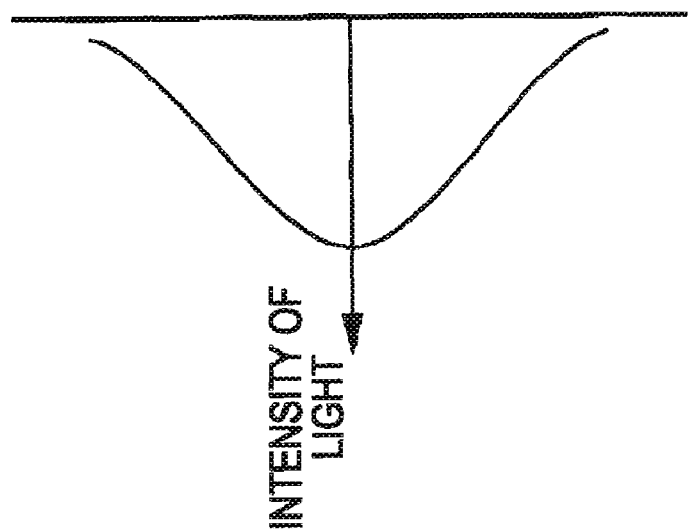
FIG. 24B is a graph taken along line XXIVB-XXIVB of FIG. 24A.
Figure 24A:
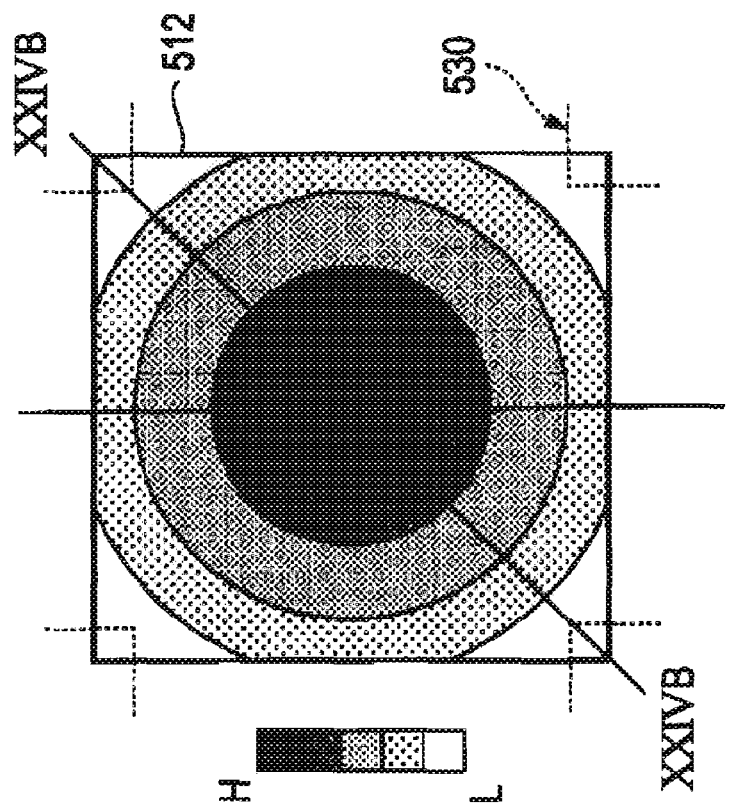
FIG. 24A is a diagram showing the intensity distribution of light.

FIG. 24A shows the intensity distribution of the light collected in the circular region. FIG. 24B is a graph taken along line XXIVB-XXIVB of FIG. 24A. According to FIGS. 24A and 24B, the intensity of the light is highest in the center of the circular region, that is, in the center of the pixel region 512, and decreases toward the periphery of the pixel region 512, and little incident light is collected onto the corners of the pixel region 512.

In this embodiment, the TFTs 530 are disposed so as to overlap the corners of the pixel regions 512 in plan view. Accordingly, the interpixel regions can be reduced to increase the aperture ratio of the pixel regions 512. Thus, the area where light enters the pixel regions 512 can be increased to allow more light with high intensity to enter the pixel regions 512. The use of microlenses for the pixel regions 512 with the increased aperture ratio can produce a synergistic effect of increasing light availability.

Light collected on the corners of the pixel regions 512 has low intensity even if the microlens array 540 is provided in the liquid crystal device 500. The TFTs 530 block only the low-intensity light collected on the corners of the pixel regions 512, and thus the pixel regions 512 exhibit little loss of light in total. Accordingly, the use of the microlens array 540 increases the light availability.

Sixth Embodiment

Figure 25:
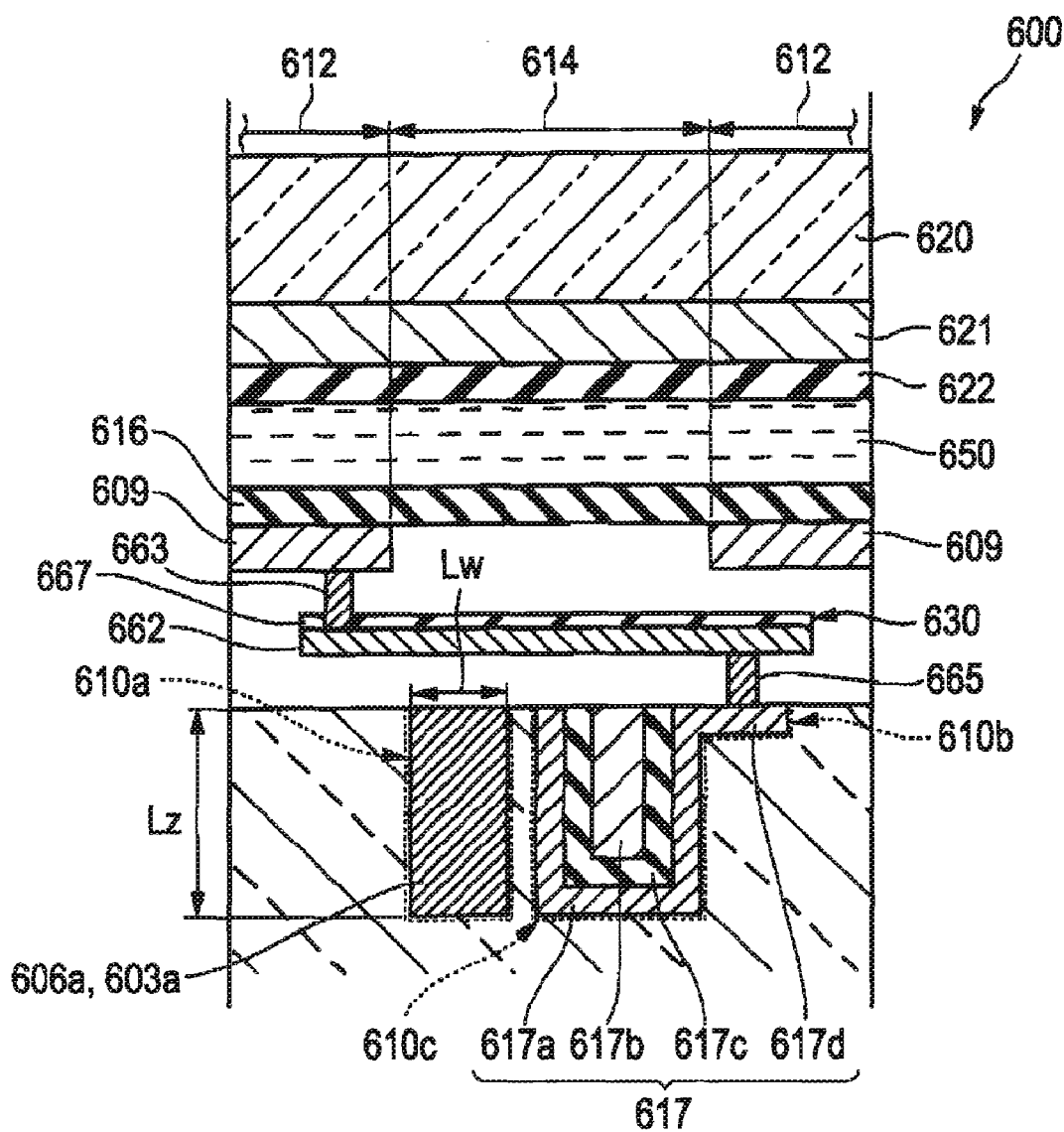
FIG. 25 is a sectional view of a liquid crystal device according to a sixth embodiment of the invention.

A sixth embodiment of the invention will be described with reference to the drawings, where the individual components are illustrated on different scales if necessary for convenience of illustration, as in the first embodiment. This embodiment is different from the first embodiment in that wiring (data lines and scanning lines) and capacitors are disposed in different grooves. The description below will focus on this point, and no description will be given to the same components as in the first embodiment. FIG. 25 is a sectional view of a TFT array substrate 610 of a liquid crystal device 600 according to this embodiment, corresponding to a cross section taken along line G-G of FIG. 3.

A light-shielding film (not shown) is disposed in interpixel regions 614 of the TFT array substrate 610. Grooves 611a and 610c are disposed in a region where the light-shielding film is disposed. The grooves 610a and 610c have a uniform width over the depth from the top surface of the TFT array substrate 610 and extend in parallel along the interpixel regions 614. The grooves 610a and 610c have substantially the same depth. Flat portions 610b protrude from the grooves 610c so as to overlap pixel regions 612 in plan view.

Capacitors 617, data lines 606a, scanning lines 603a, and TFTs 630 are disposed in the interpixel regions 614. As in the first embodiment, the data lines 606a and the scanning lines 603a are formed in the grooves 610a along the cross-sectional shape thereof so as to have a uniform width over the depth from the top surface of the TFT array substrate 610. As in the second embodiment, the data lines 606a and the scanning lines 603a satisfy the following relationship:

$$0.5 < (Lz/Lw) < 15$$

wherein Lz is the depth of the data lines 606a and the scanning lines 603a and Lw is the width of the data lines 606a and the scanning lines 603a.

The capacitors 617 are disposed in the grooves 610c and are mainly composed of capacitor electrodes 617a, capacitor electrodes 617b, and insulating films 617c. The capacitor electrodes 617a are formed along wall surfaces of the grooves 610a. The insulating films 617c are formed on the capacitor electrodes 617a. The capacitor electrodes 617b are disposed opposite the capacitor electrodes 617a with the insulating films 617c disposed therebetween. The capacitor electrodes 617b have flat portions 617d extending over the flat portions 610b of the TFT array substrate 610.

In this embodiment, the wiring (the data lines 606a and the scanning lines 603a) and the capacitors 617 are disposed in the different grooves 610a and 610c, respectively, so that they can be separated from each other to prevent parasitic capacitance from occurring therebetween. This embodiment can also simplify the structures of the grooves 610a and 610c to facilitate production of the liquid crystal device 500.

Seventh Embodiment

A seventh embodiment of the invention will be described with reference to the drawings, where the individual components are illustrated on different scales if necessary for convenience of illustration, as in the first embodiment. In this embodiment, no description will be given to the same components as in the first embodiment.

Figure 26:
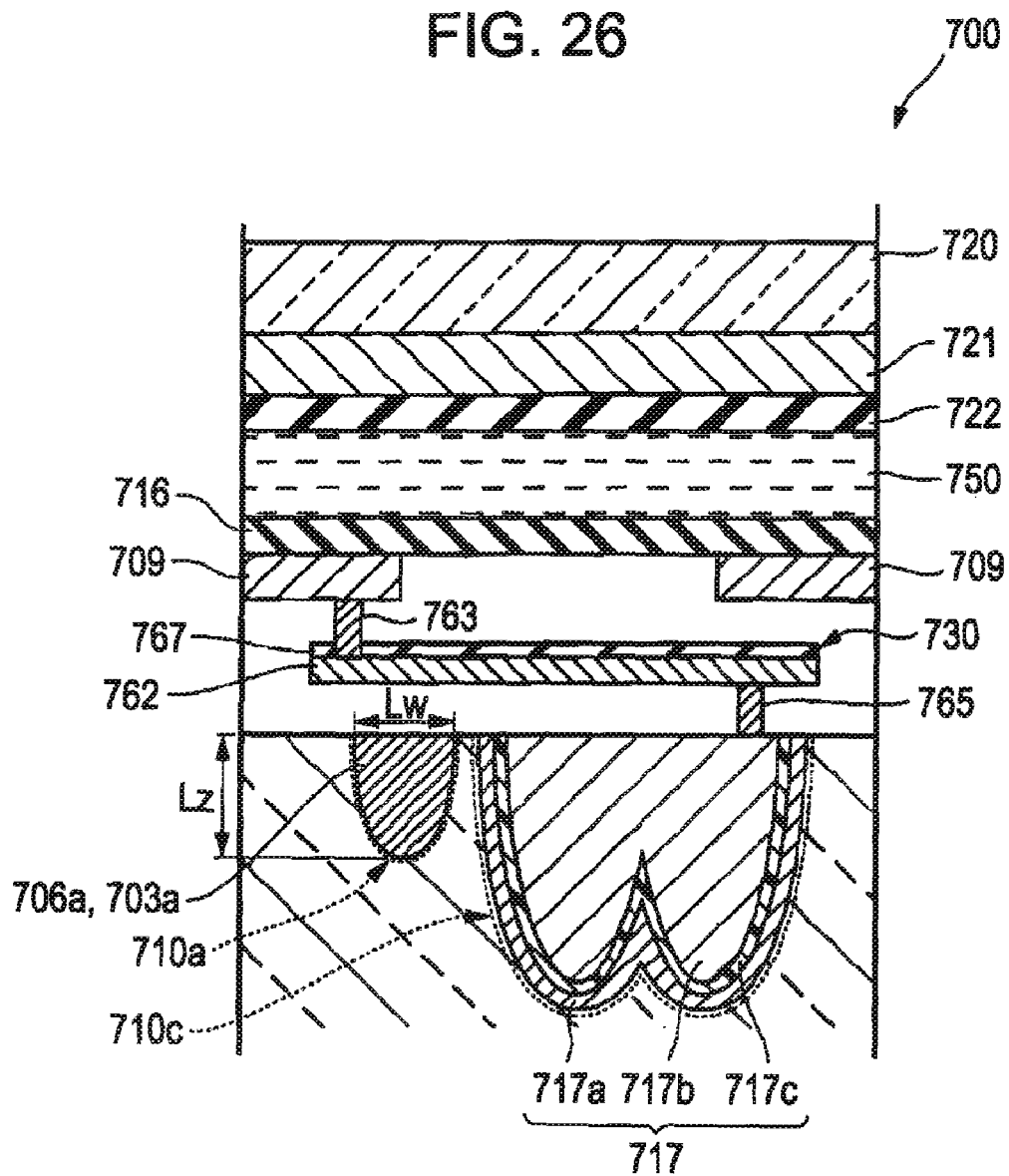
FIG. 26 is a sectional view of a liquid crystal device according to a seventh embodiment of the invention.

FIG. 26 is a sectional view of a TFT array substrate 710 of a liquid crystal device 700 according to this embodiment, corresponding to the cross section taken along line G-G of FIG. 3. The seventh embodiment is different from the sixth embodiment in the shape of grooves, although wiring (data lines and scanning lines) and capacitors are disposed in different grooves as in the sixth embodiment.

Grooves 710a and 710c are disposed in interpixel regions of the TFT array substrate 710. As in the first embodiment, the grooves 710a are formed such that the width thereof decreases gradually along the depth from the top surface of the TFT array substrate 710. The grooves 710c are formed such that the centers thereof (in the horizontal direction in FIG. 26) are constricted toward the top surface of the TFT array substrate 710.

Data lines 706a and scanning lines 703a are disposed in the grooves 710a. The data lines 706a and the scanning lines 703a are formed along wall surfaces of the grooves 710a such that the width thereof decreases gradually along the depth from the top surface of the TFT array substrate 710. As in the first embodiment, the data lines 706a and the scanning lines 703a satisfy the following relationship:

$$1<(Lz/Lw)<50$$

wherein Lz is the depth of the data lines 706a and the scanning a lines 703a and Lw is the width of the data lines 706a and the scanning lines 703a.

Capacitors 717 are disposed in the grooves 710c. Capacitor electrodes 717a are outer electrodes disposed along the bottom and side surfaces of the grooves 710c. The centers of the capacitor electrodes 717a (in the horizontal direction in FIG. 26) are constricted toward the top surface of the TFT array substrate 710. Capacitor electrodes 717b are surrounded by the capacitor electrodes 717a with insulating films 717c disposed therebetween.

In this embodiment, the centers of the grooves 710c are constricted toward the top surface of the TFT array substrate 710, and thus the centers of the capacitor electrodes 717a, which are disposed in the grooves 710a, are similarly constricted toward the top surface of the TFT array substrate 710. This structure can increase the surface area of the capacitor electrodes 717a to increase the capacitance of the capacitors 717.

Eighth Embodiment

Figure 27:
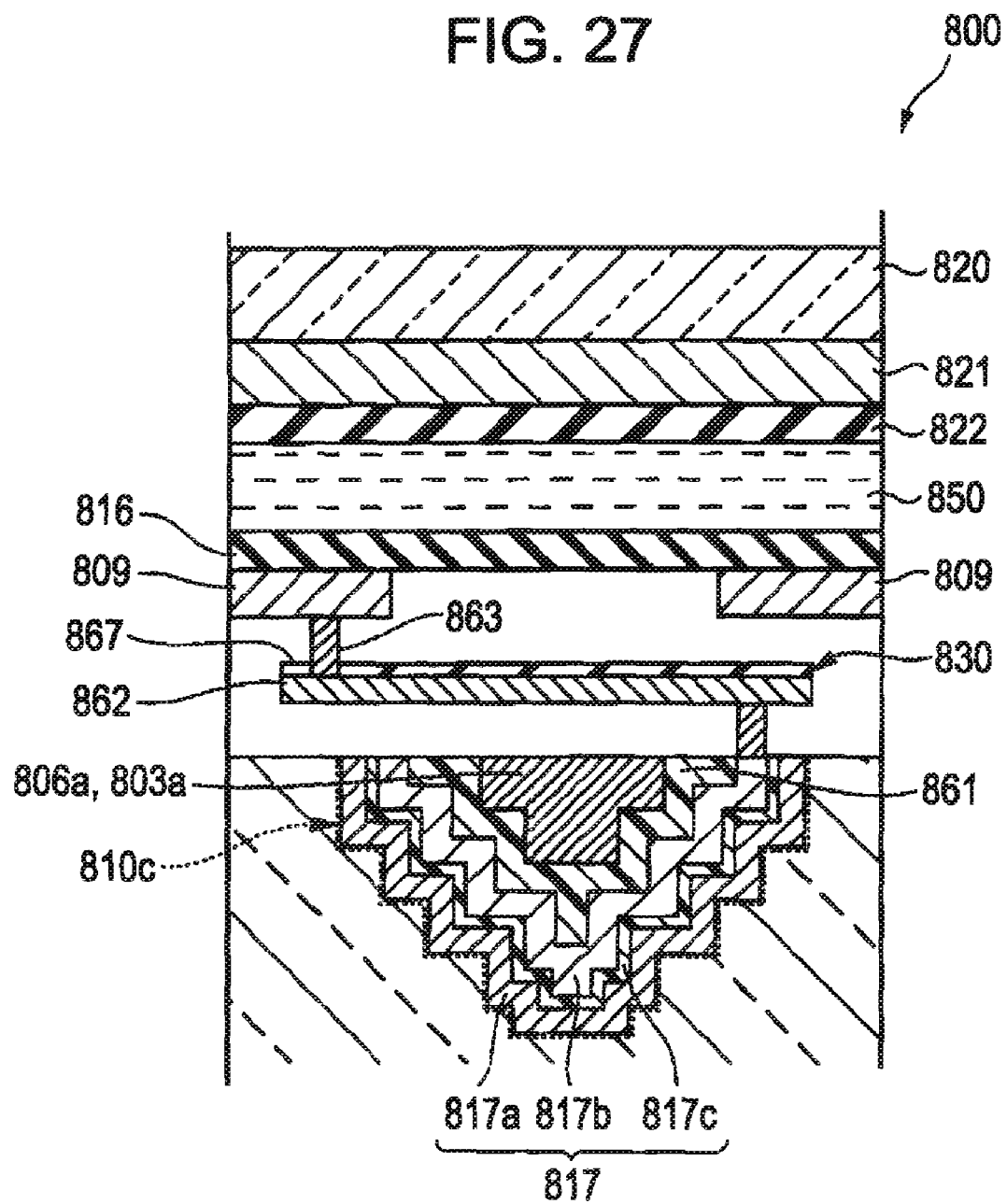
FIG. 27 is a sectional view of a liquid crystal device according to an eighth embodiment of the invention.

An eighth embodiment of the invention will be described with reference to the drawings, where the individual components are illustrated on different scales if necessary for convenience of illustration, as in the first embodiment. In this embodiment, no description will be given to the same components as in the first embodiment. FIG. 27 is a sectional view of a TFT array substrate 810 of a liquid crystal device 800 according to this embodiment, corresponding to the cross section taken along line G-G of FIG. 3.

This embodiment is different from the first embodiment in the shape of grooves. Grooves 810a are disposed in interpixel regions of the TFT array substrate 810. The depth of the grooves 810a increases stepwise toward the centers thereof in the horizontal direction in FIG. 27.

Data lines 806a, scanning lines 803a, and capacitors 817 are disposed in the grooves 810a. The data lines 806a and the scanning lines 803a are formed along wall surfaces of the grooves 810a so that they are stepped toward the centers thereof in the horizontal direction in FIG. 27. The capacitors 817 are mainly composed of capacitor electrodes 817a, insulating films 817c, and capacitor electrodes 817b which are stepped along the shape of the grooves 810a.

In this embodiment, the depth of the grooves 810a increases stepwise toward the centers thereof in the horizontal direction in FIG. 27, and thus the capacitor electrodes 817a and 817b, which are disposed in the grooves 810a, are similarly stepped. This structure can increase the surface area of the capacitor electrodes 817a to increase the capacitance of the capacitors 817. In addition, the grooves 810a are stepped so that the capacitor electrodes 817a and 817b, the data lines 806a, and the scanning lines 803a can easily be formed in the grooves 810a.

Ninth Embodiment

Figure 28:
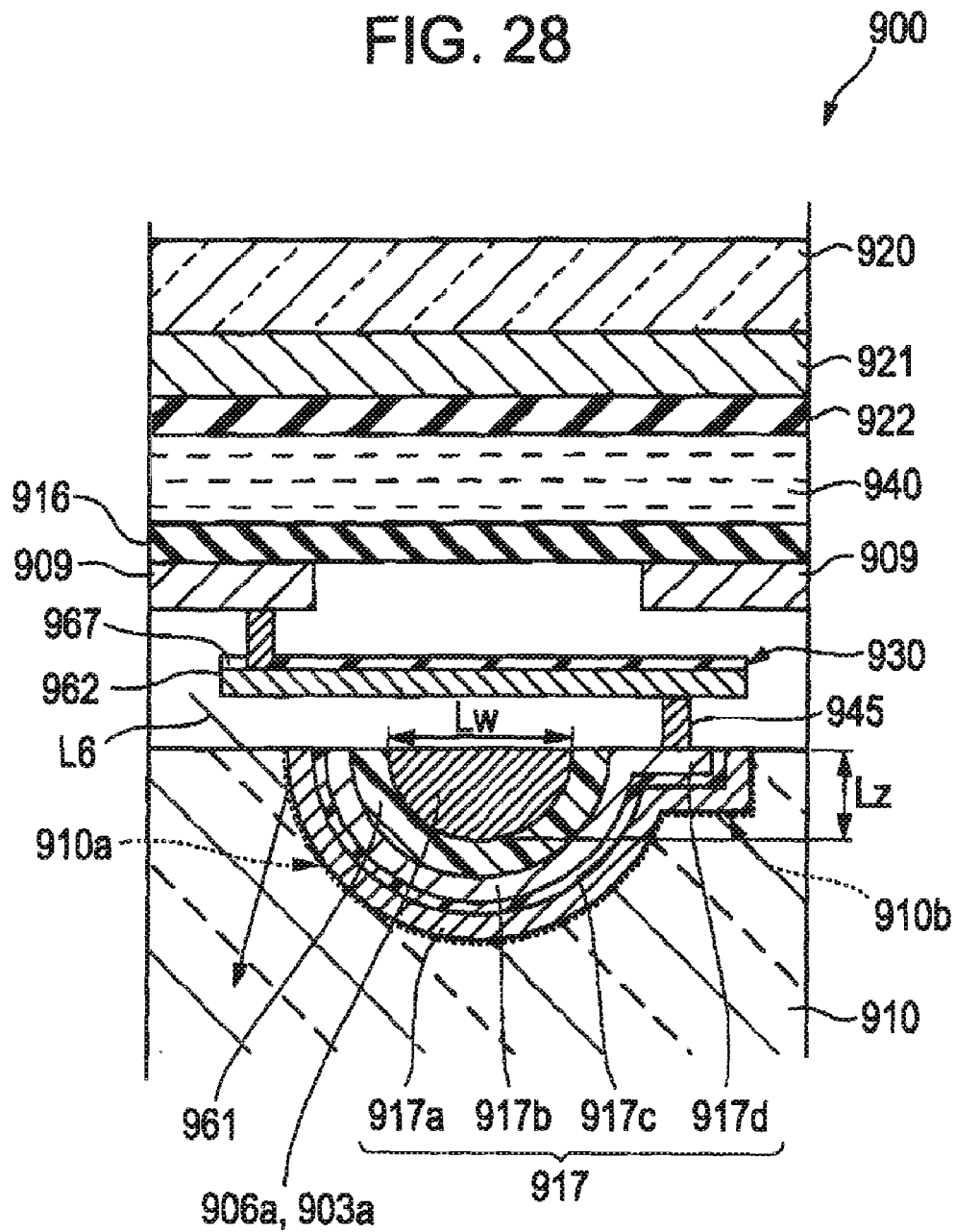
FIG. 28 is a sectional view of a liquid crystal device according to a ninth embodiment of the invention.

A ninth embodiment of the invention will be described with reference to the drawings, where the individual components are illustrated on different scales if necessary for convenience of illustration, as in the first embodiment. In this embodiment, no description will be given to the same components as in the first embodiment. FIG. 28 is a sectional view of a TFT array substrate 910 of a liquid crystal device 900 according to this embodiment, corresponding to the cross section taken along line G-G of FIG. 3.

This embodiment is different from the first embodiment in the shape of grooves. Grooves 910a are disposed in interpixel regions of the TFT array substrate 910. The depth of the grooves 910a increases toward the centers thereof in the horizontal direction in FIG. 28 so that they are arc-shaped. Data lines 906a, scanning lines 903a, and capacitors 917 are disposed in the grooves 910a. The data lines 906a and the scanning lines 903a are formed in a semicircular shape along wall surfaces of the grooves 910a. The data lines 906a and the scanning lines 903a satisfy the following relationship:

$$0.5<(Lz/Lw)<15$$

wherein Lz is the depth of the data lines 906a and the scanning lines 903a and Lw is the width of the data lines 906a and the scanning lines 903a. The capacitors 917 are mainly composed of capacitor electrodes 917a, insulating films 917c, and capacitor electrodes 917b which are arc-shaped along the wall surfaces of the grooves 910a.

In this embodiment, the depth of the grooves 910a increases toward the centers thereof in the horizontal direction in FIG. 28 so that they are arc-shaped, and thus the capacitor electrodes 917a and 917b, which are disposed in the grooves 910a, are similarly arc-shaped. This structure can reflect part of external light traveling toward the capacitor electrodes 917a in a direction normal to the top surface of the TFT array substrate 910 to increase light availability.

Tenth Embodiment

Figure 29:
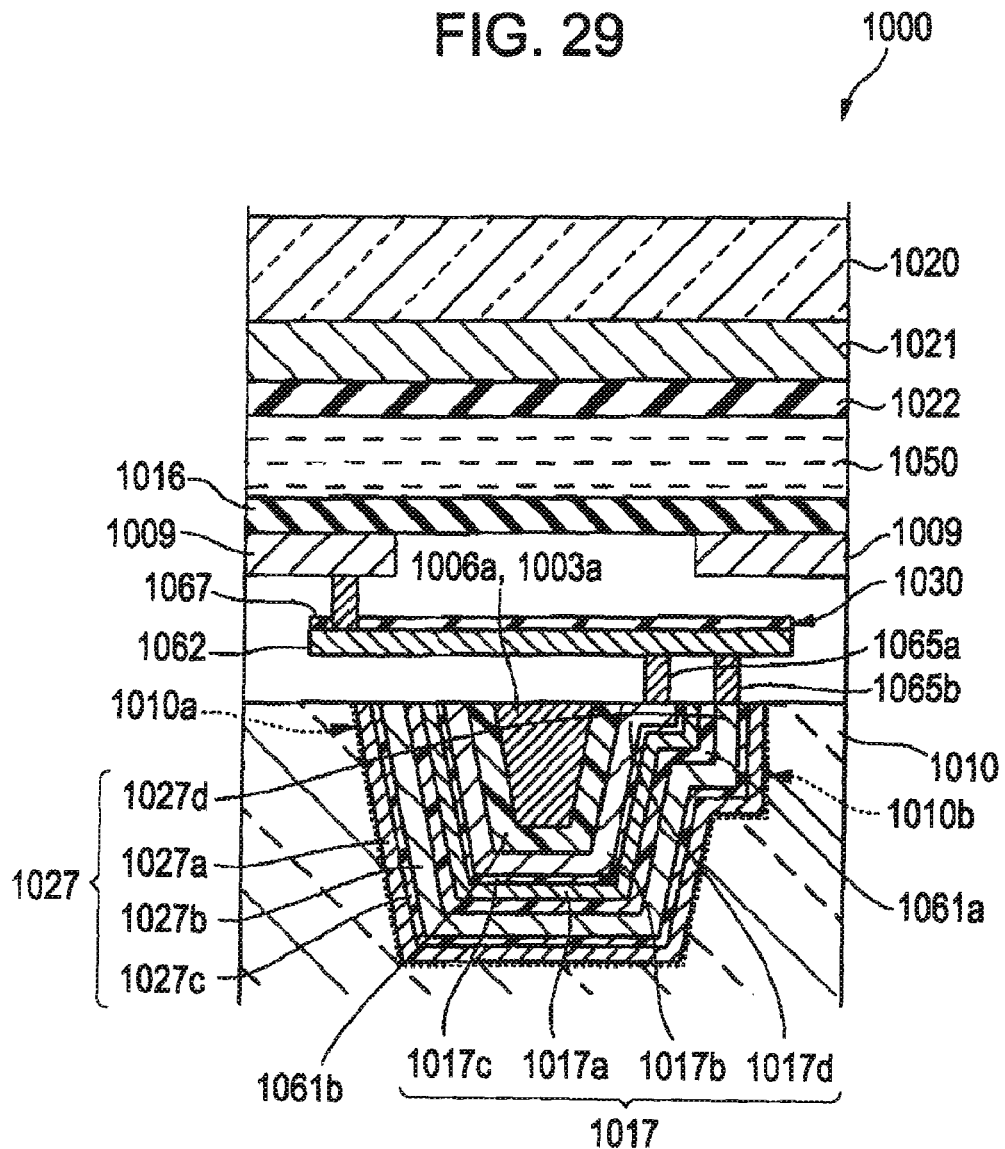
FIG. 29 is a sectional view of a liquid crystal device according to a tenth embodiment of the invention.

A tenth embodiment of the invention will be described with reference to the drawings, where the individual components are illustrated on different scales if necessary for convenience of illustration, as in the first embodiment. In this embodiment, no description will be given to the same components as in the first embodiment. FIG. 29 is a sectional view of a TFT array substrate 1010 of a liquid crystal device 1000 according to this embodiment, corresponding to the cross section taken along line G-G of FIG. 3.

This embodiment is different from the first embodiment in that pairs of capacitors are provided. Grooves 1010a having flat portions 1010b are disposed in interpixel regions of the TFT array substrate 1010. The width of the grooves 1010a decreases at a constant rate along the depth thereof from the top surface of the TFT array substrate 1010. Data lines 1006a and scanning lines 1003a are disposed in the grooves 1010a. The data lines 1006a and the scanning lines 1003a are formed along wall surfaces of the grooves 1010a so that the width thereof decreases at a constant rate along the depth from the top surface of the TFT array substrate 1010.

Inner capacitors 1017 and outer capacitors 1027 are disposed in layers in the grooves 1010a.

The capacitors 1017 and 1027 have flat portions 1017d and 1027d, respectively, which are disposed over the flat portions 1010b of the grooves 1010a. The flat portions 1017d and 1027d are connected to heavily doped drain regions of TFTs 1030 via contact holes 1065a and 1065b, respectively. According to this embodiment, the capacitors 1017 and 1027 are disposed in the grooves 1010a so as to form a double-layer structure that can provide higher capacitance.

Projector

Figure 30:
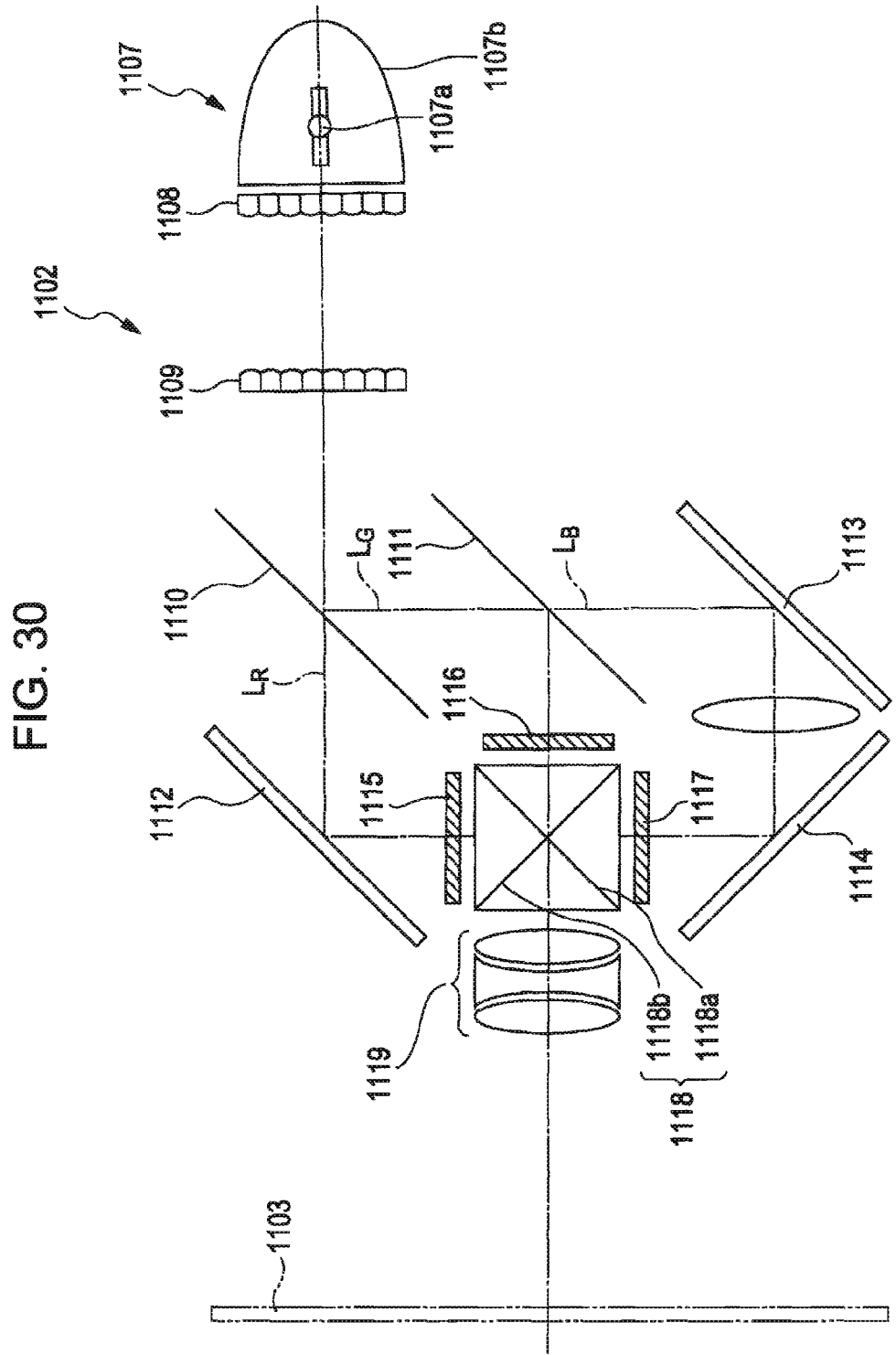
FIG. 30 is a diagram of a projector according to another embodiment of the invention.

An example of a projector including the liquid crystal device according to any of the embodiments described above as an optical modulator will be described. FIG. 30 is a schematic diagram illustrating the inner structure of a projector 1102 as an example of a projection display. This projector 1102 mainly includes a light source 1107, fly-eye lenses 1103 and 1109, dichroic mirrors 1110 and 1111, reflective mirrors 1112, 1113, and 1114, liquid crystal light valves 1115, 1116, and 1117, a cross dichroic prism 1118, and a protection lens 1119. This projector 1102 is, for example, a color liquid crystal projector including transmissive liquid crystal light valves for red (R), green (G), and blue (B) colors, The light source 1107 includes a lamp 1107a that emits, for example, white light (such as a high-pressure mercury lamp) and a reflector 1107b that reflects the light emitted from the lamp 1107a. The fly-eye lenses 1108 and 1109 are optical components that convert the illuminance distribution of the light into a uniform distribution. The fly-eye lens 1108 is disposed on the light source 1107 side to form secondary optical images, and the fly-eye lens 1109 is disposed on the screen side to superimpose the secondary optical images.

The dichroic mirror 1110 is an optical component that transmits a red light component $L_R$ contained in the write light emitted from the light source 1107 and reflects a green light component $L_G$ and a blue light component $L_B$ contained in the white light. The dichroic mirror 1111 is an optical component that reflects the green light component $L_G$ and transmits the blue light component $L_B$.

The liquid crystal light valves 1115, 1116, and 1117 are optical modulators that modulate the red light component $L_R$, the green light component $L_G$, and the blue light component $L_B$, respectively, according to predetermined image signals. In this embodiment, any of the liquid crystal devices 100 to 1000 may be used as the liquid crystal light valves 1115, 1116, and 1117.

The cross dichroic prism 1118 is an optical component including four right-angle prisms that are bonded to each other. Dielectric multilayer films 1118a and 1118b are formed on inner surfaces of the cross dichroic prism 1118 so as to cross each other. The dielectric multilayer film 1118a reflects the red light component $L_R$, and the dielectric multilayer film 1118b reflects the blue light component $L_B$. These dielectric multilayer films 1118a and 1118b combine the red light component $L_R$, the green light component $L_G$, and the blue light component $L_B$ into color image light (video light). The projection lens 1119 is an optical component that projects the video light onto a screen 1103.

The operation of the projector 1102 will be described. When the projector 1102 is operated, the lamp 1107a emits white light, and a collimator lens (not shown) collimates the white light and its reflection by the reflector 1107b. The fly-eye lenses 1108 and 1109 convert the illuminance distribution of the collimated light into a uniform distribution.

The light then reaches the dichroic mirrors 1110 and 1111, which separate the light into the red light component $L_R$, the green light component $L_G$, and the blue light component $L_B$. The dichroic mirrors 1110 and 1111 and the reflective mirrors 1112, 1113, and 1114 guide the light components $L_R$, $L_G$ and $L_B$ to the liquid crystal light valves 1115, 1116, and 1117, respectively, which modulate them into desired patterns. The protection lens 1119 projects the modulated light components $L_R$, $L_G$, and $L_B$ onto the screen 1103. According to this embodiment, the projector 1102 can provide a bright display with high contrast because the projector 1102 includes any of the liquid crystal devices 100 to 1000, which have an increased aperture ratio to enhance light availability.

Electronic Apparatus

Figure 31:
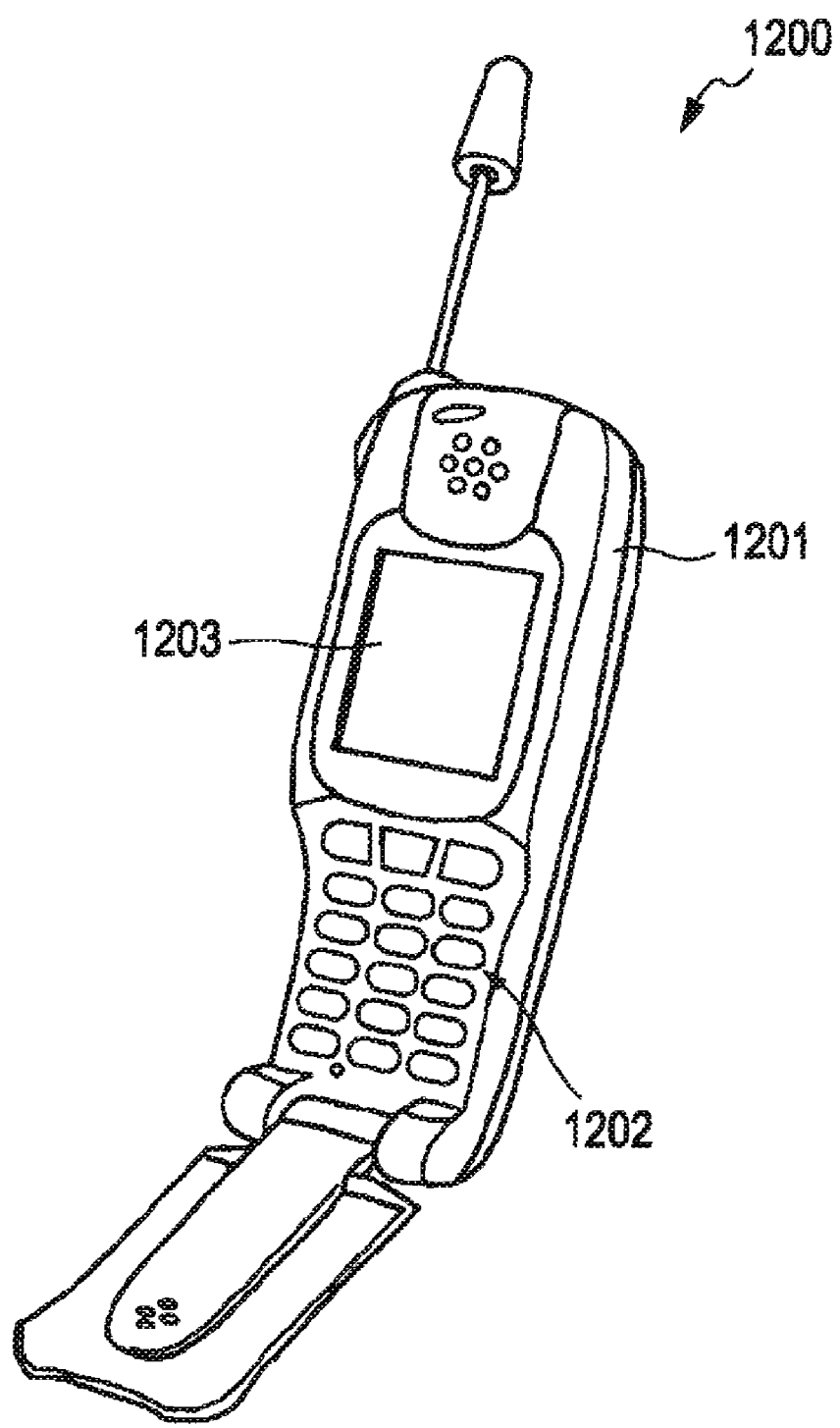
FIG. 31 is a diagram of an electronic apparatus according to another embodiment of the invention.

A cellular phone will be described as an example of an electronic apparatus according to an embodiment of the invention. FIG. 31 is a perspective view of a cellular phone 1200. This cellular phone 1200 includes a casing 1201, an operating unit 1202 having operating buttons, and a display unit 1203 that displays, for example, images, videos, and characters. The display unit 1203 includes any of the liquid crystal devices 100 to 1000 according to the embodiments described above.

According to this embodiment, the cellular phone 1200 can provide a bright display with high contrast because the cellular phone 1200 includes any of the liquid crystal devices 100 to 1000, which have an increased aperture ratio to enhance light availability.

The technical field of the invention is not limited to the embodiments described above, and various modifications are permitted within the scope of the invention. For example, the inclination angle of the wall surfaces of the grooves 10a, which is adjusted by changing the temperature of the TFT array substrate 10 in the embodiments described above, may also be adjusted by other methods. For example, the inclination angle may be adjusted by appropriately selecting the etchant gas used for dry matching. For example, the etching may be promoted using a mixture of a saturated halocarbon gas, such as $CF_4$ or $CCl_4$, and an additive gas that inhibits polymerization to promote the etching, such as $Cl_2$, $O_2$, or $F_2$. On the other hand, an additive gas such as $H_2$, $C_2F_4$, or $CH_4$ produces fluorocarbons through polymerization with $CF_4$. Such fluorocarbons protect the wall surfaces of the grooves 10a from being etched. Thus, the inclination angle of the wall surfaces of the grooves 10a can be adjusted to a desired angle by appropriately selecting the etching gas used. Alternatively, the inclination angle can be adjusted by repeating photolithography and dry etching.

In the embodiments described above, wiring (data lines and scanning lines) and capacitors are disposed in grooves formed on a TFT array substrate, although other structures may also be used. For example, part of TFTs (e.g., semiconductor layers) may be disposed in the grooves.

What is claimed is:

1. An electrooptical device comprising:
a substrate having pixel regions arranged in a matrix;
pixel electrodes disposed in the pixel regions of the substrate;
switching elements disposed between the pixel regions of the substrate and electrically connected to the pixel electrodes;
capacitors disposed between the pixel regions of the substrate to hold electrical charge on the pixel electrodes, each including a first capacitor electrode, an insulating film, and a second capacitor electrode;
wiring disposed between the pixel regions of the substrate, including data lines and scanning lines corresponding to the switching elements; and
grooves disposed in a surface of the substrate so as to extend between the pixel regions thereof, both the capacitors and the scanning lines being at least partially disposed in the grooves, wherein the capacitor electrodes are formed along bottom and side surfaces of the grooves.

2. The electrooptical device according to claim 1, wherein the cross-sectional area of the grooves is larger on the opening side thereof than on the bottom side thereof.

3. The electrooptical device according to claim 1, further comprising light-shielding portions that cover intersection regions of the data lines and the scanning lines in plan view, wherein the width of the data lines and the scanning lines is smaller than the maximum width of the light-shielding portions.

4. The electrooptical device according to claim 3, wherein the switching elements overlap the intersection regions of the wiring in plan view;
the wiring has flat portions electrically connected thereto and extending from regions of the grooves corresponding to the intersection regions; and
the switching elements and the flat portions are connected via contact holes.

5. The electrooptical device according to claim 3, wherein the switching elements are disposed in regions covered by the light-shielding portions in plan view.

6. The electrooptical device according to claim 1, wherein the grooves extend along the capacitor electrodes of the capacitors and the wiring;
the capacitor electrodes and the wiring are at least partially disposed in the grooves and are separated by insulating films; and
the capacitor electrodes extend through the grooves along the wiring.

7. The electrooptical device according to claim 6, wherein the capacitor electrodes are closer to side surfaces of the grooves than the wiring.

8. The electrooptical device according to claim 1, further comprising microlenses that collect light into the pixel regions.

9. An electronic apparatus comprising the electrooptical device according to claim 1.

10. A projector comprising the electrooptical device according to claim 1.

11. An electrooptical device comprising:
a substrate having pixel regions arranged in a matrix;
pixel electrodes disposed in the pixel regions of the substrate;
switching elements disposed between the pixel regions of the substrate and electrically connected to the pixel electrodes;
capacitors disposed between the pixel regions of the substrate to hold electrical charge on the pixel electrodes, each including a first capacitor electrode, an insulating film, and a second capacitor electrode;
wiring disposed between the pixel regions of the substrate, including data lines and scanning lines corresponding to the switching elements; and
grooves disposed in a surface of the substrate so as to extend between the pixel regions thereof, the data lines being at least partially disposed in the grooves between the switching elements and the substrate.

12. An electrooptical device comprising:
a substrate having pixel regions arranged in a matrix;
pixel electrodes disposed in the pixel regions of the substrate;
switching elements disposed between the pixel regions of the substrate and electrically connected to the pixel electrodes;
capacitors disposed between the pixel regions of the substrate to hold electrical charge on the pixel electrodes, each including a first capacitor electrode, an insulating film, and a second capacitor electrode;
wiring disposed between the pixel regions of the substrate, including data lines and scanning lines corresponding to the switching elements; and
grooves disposed in a surface of the substrate so as to extend between the pixel regions thereof, the capacitors being at least partially disposed in the grooves, the data lines being at least partially disposed in the grooves between the switching elements and the substrate, wherein the capacitor electrodes are formed along bottom and side surfaces of the grooves.

13. An electrooptical device comprising:
a substrate having pixel regions arranged in a matrix;
pixel electrodes disposed in the pixel regions of the substrate;
switching elements disposed between the pixel regions of the substrate and electrically connected to the pixel electrodes;
capacitors disposed between the pixel regions of the substrate to hold electrical charge on the pixel electrodes, each including a first capacitor electrode, an insulating film, and a second capacitor electrode;
wiring disposed between the pixel regions of the substrate, including data lines and scanning lines corresponding to the switching elements; and
grooves disposed in a surface of the substrate so as to extend between the pixel regions thereof and along both the capacitor electrodes of the capacitors and the wiring, the capacitors being at least partially disposed in the grooves, wherein the capacitor electrodes are formed along bottom and side surfaces of the grooves, wherein
the capacitor electrodes and the wiring are at least partially disposed in the grooves and are separated by insulating films; and
the capacitor electrodes extend through the grooves along the wiring.

14. An electrooptical device comprising:
a substrate having pixel regions arranged in a matrix;
pixel electrodes disposed in the pixel regions of the substrate;
switching elements disposed between the pixel regions of the substrate and electrically connected to the pixel electrodes;
capacitors disposed between the pixel regions of the substrate to hold electrical charge on the pixel electrodes, each including a first capacitor electrode, an insulating film, and a second capacitor electrode;
wiring disposed between the pixel regions of the substrate, including data lines and scanning lines corresponding to the switching elements, wherein the switching elements overlap intersection regions of the wiring in plan view;
light-shielding portions that cover the intersection regions of the data lines and the scanning lines in plan view, wherein the width of the data lines and the scanning lines is smaller than the maximum width of the light-shielding portions; and
grooves disposed in a surface of the substrate so as to extend between the pixel regions thereof, the capacitors being at least partially disposed in the grooves, wherein the capacitor electrodes are formed along bottom and side surfaces of the grooves, wherein
the wiring has flat portions electrically connected thereto and extending from regions of the grooves corresponding to the intersection regions; and
the switching elements and the flat portions are connected via contact holes.

* * * * *